United States Patent
Kwon et al.

(10) Patent No.: US 8,455,890 B2
(45) Date of Patent: Jun. 4, 2013

(54) METHOD FOR COATING LIGHT-EMITTING DEVICES, LIGHT COUPLER, AND METHOD FOR MANUFACTURING THE LIGHT COUPLER

(75) Inventors: Sung Hoon Kwon, Seoul (KR); Su Eun Chung, Seoul (KN)

(73) Assignee: SNU R&DB Foundation, Seoul (KR)

( * ) Notice: Subject to any disclaimer, the term of this patent is extended or adjusted under 35 U.S.C. 154(b) by 0 days.

(21) Appl. No.: 13/262,342

(22) PCT Filed: Mar. 29, 2010

(86) PCT No.: PCT/KR2010/001893
§ 371 (c)(1),
(2), (4) Date: Sep. 30, 2011

(87) PCT Pub. No.: WO2010/114260
PCT Pub. Date: Oct. 7, 2010

(65) Prior Publication Data
US 2012/0032200 A1    Feb. 9, 2012

(30) Foreign Application Priority Data
Mar. 30, 2009   (KR) .................. 10-2009-0026991

(51) Int. Cl.
*H01L 33/00* (2010.01)
*H01L 21/00* (2006.01)
(52) U.S. Cl.
USPC .............. 257/88; 257/E33.061; 257/E33.073; 257/E27.12; 438/34

(58) Field of Classification Search
CPC ..... H01L 25/0753; H01L 33/62; H01L 27/153; H01L 27/1214; H01L 27/12; G03F 7/2022; G03F 7/0007
USPC ............... 257/88, E33.031, E33.073, E27.12; 438/22, 27, 34
See application file for complete search history.

(56) References Cited

U.S. PATENT DOCUMENTS

| 6,069,440 | A | 5/2000 | Shimizu et al. |
| 2006/0097385 | A1* | 5/2006 | Negley .......................... 257/722 |
| 2008/0304250 | A1* | 12/2008 | Harbers et al. .................. 362/84 |
| 2009/0039762 | A1 | 2/2009 | Park et al. |

FOREIGN PATENT DOCUMENTS

| JP | 05-341155 | 12/1993 |
| JP | 2001-250255 | 9/2001 |
| KR | 10-2005-0071780 | 7/2005 |

* cited by examiner

*Primary Examiner* — Nikolay Yushin
(74) *Attorney, Agent, or Firm* — Sherr & Jiang, PLLC

(57) ABSTRACT

A method of coating a light emitting device is provided. The method includes preparing a plurality of light emitting devices. The plurality of light emitting devices are coated with a first photocurable liquid. First light is selectively exposed to the first photocurable liquid to form a first coating layer on at least a partial region of a surface of each of the plurality of light emitting devices. The plurality of light emitting devices on which the first coating layer is formed are coated with a second photocurable liquid. Second light is selectively exposed to the second photocurable liquid to form a second coating layer on at least a partial region of the surface of each of the plurality of light emitting devices or a surface of the first coating layer. The first coating layer corresponds to the cured first photocurable liquid, while the second coating layer corresponds to the cured second photocurable liquid.

37 Claims, 16 Drawing Sheets

FIG.11
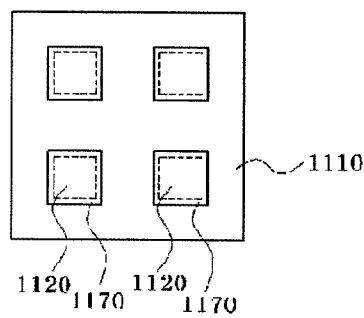
(a)
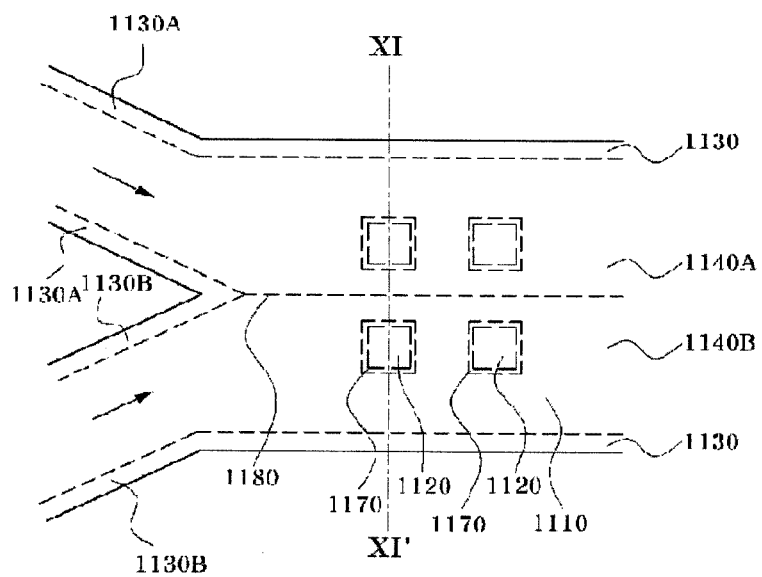
(b)
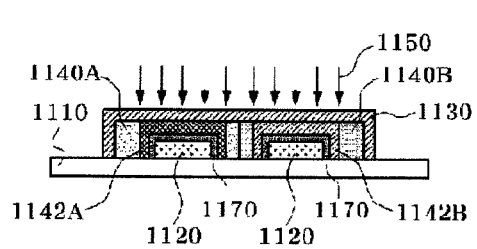
(c)
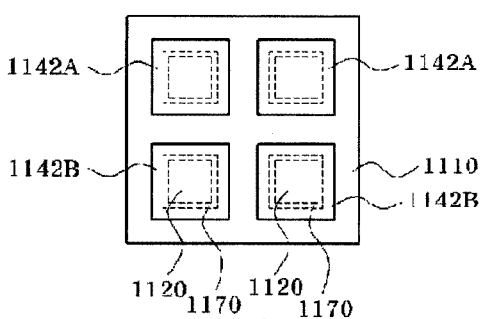
(d)

FIG.13
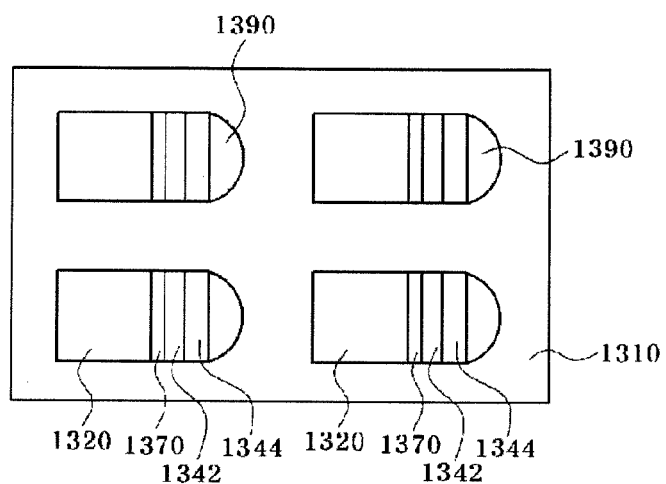
(a)
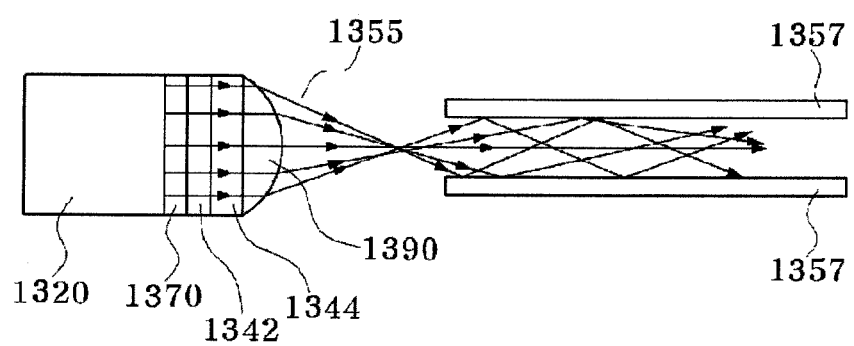
(b)

FIG.14
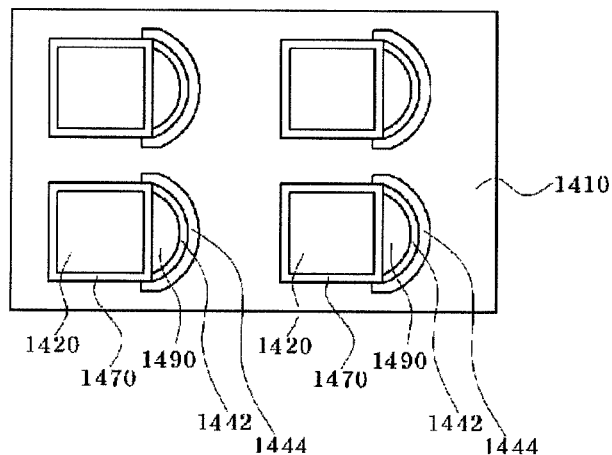
FIG.15
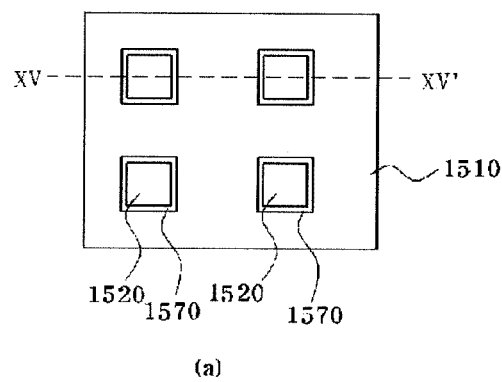
(a)
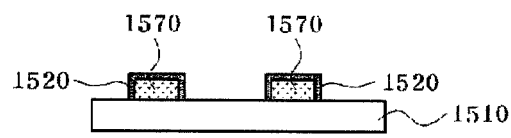
(b)

FIG.17
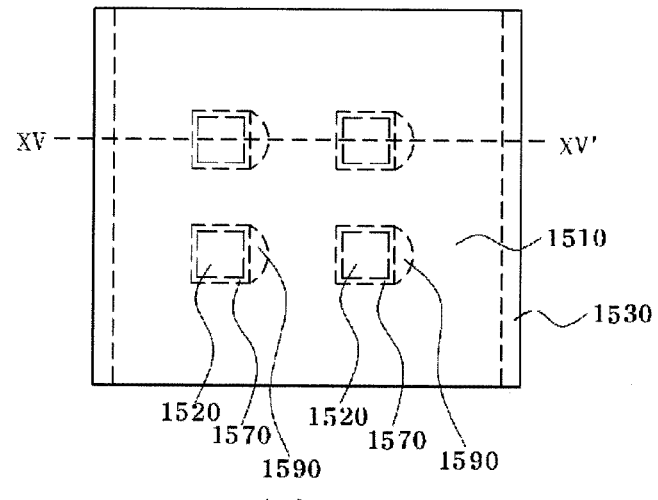
(a)
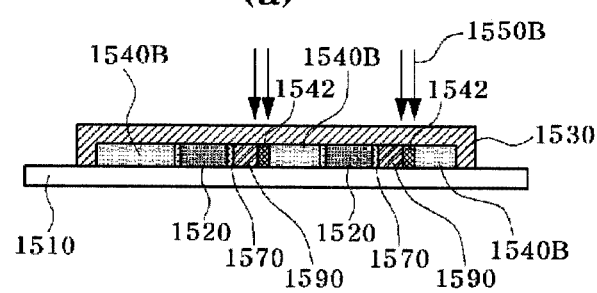
(b)
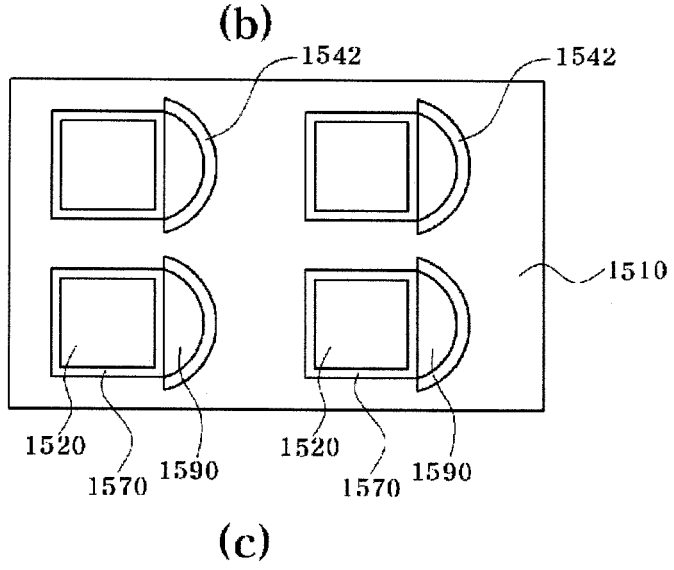
(c)

METHOD FOR COATING LIGHT-EMITTING DEVICES, LIGHT COUPLER, AND METHOD FOR MANUFACTURING THE LIGHT COUPLER

CROSS REFERENCE TO PRIOR APPLICATIONS

This application is a National Stage Patent Application of PCT International Patent Application No. PCT/KR2010/001893 (filed on Mar. 29, 2010) under 35 U.S.C. §371, which claims priority to Korean Patent Application No. 10-2009-0026991 (filed on Mar. 30, 2009), which are all hereby incorporated by reference in their entirety.

TECHNICAL FIELD

The present disclosure relates to a method of coating a light emitting device, a light coupler, and a method of fabricating a light coupler.

BACKGROUND ART

A conventional technique of coating a light emitting device (e.g., a light emitting diode (LED)) includes directly coating a polymer (e.g., epoxy) mixed with the phosphor on the LED and curing the polymer mixed with the phosphor. In the conventional technique, individual LEDs are separately coated with the polymer containing the phosphor.

DISCLOSURE

Technical Solution

The present disclosure provides a method of coating a phosphor on a light emitting device.

Also, the present disclosure provides a method of uniformly coating a phosphor on a surface of a light emitting device.

In addition, the present disclosure provides a method of coating a multilayered phosphor required for fabricating a white LED.

Furthermore, the present disclosure provides a method of partially coating a phosphor on a lateral surface of an edge LED (ELED).

Also, the present disclosure provides a method of forming a lens for a light coupler required to use an ELED as a backlight unit (BLU), using an optical micro fluidic technique.

According to an exemplary embodiment, a method of coating a light emitting device is provided. In the method of coating a light emitting device, first, a plurality of light emitting devices are prepared. The plurality of light emitting devices are coated with a first photocurable liquid. First light is selectively exposed to the first photocurable liquid to form a first coating layer on at least a partial region of a surface of each of the plurality of light emitting devices. The plurality of light emitting devices on which the first coating layer is formed are coated with a second photocurable liquid. Second light is selectively exposed to the second photocurable liquid to form a second coating layer on at least a partial region of the surface of each of the plurality of light emitting devices or a surface of the first coating layer. The first coating layer corresponds to the cured first photocurable liquid, and the second coating layer corresponds to the cured second photocurable liquid.

According to another exemplary embodiment, a method of coating a light emitting device is provided. In the method of coating a light emitting device, first, a plurality of light emitting devices are prepared. The plurality of light emitting devices are dipped in a plurality of photocurable liquids using a microfluidic channel through which the plurality of photocurable liquids flow. First light is selectively exposed to the plurality of photocurable liquids to form a first coating layer on at least a partial region of a surface of each of the plurality of light emitting devices. The plurality of photocurable liquids contain different phosphors and flow through the microfluidic channel to form an interface therebetween. The first coating layer corresponds to the cured plurality of photocurable liquids.

According to another exemplary embodiment, a light coupler is provided. The light coupler includes a substrate having a plurality of light emitting devices arranged on one surface thereof, a plurality of lenses disposed on the one surface of the substrate and configured to receive light from the plurality of light emitting devices, and a first coating layer disposed on at least a partial region of a surface of each of the plurality of light emitting devices or the plurality of lenses.

According to another exemplary embodiment, a method of fabricating a light coupler is provided. In the method of fabricating a light coupler, first, a substrate having a plurality of light emitting devices arranged on one surface thereof is prepared. A plurality of lenses configured to receive light from the plurality of light emitting devices are formed on the one surface of the substrate. A first coating layer is formed on at least a partial region of a surface of each of the plurality of light emitting devices or the plurality of lenses. The formation of the first coating layer is performed before or after the formation of the plurality of lenses configured to receive light from the plurality of light emitting devices on the one surface of the substrate.

Advantageous Effect

According to a method of coating a light emitting device, a light coupler, and a method of fabricating a light coupler according to the present disclosure, a phosphor may be uniformly coated on the light emitting device.

Also, a method of coating a light emitting device, a light coupler, and a method of fabricating a light coupler according to the present disclosure may enable the patterning of a phosphor so that the phosphor can be coated a desired number of times or in desired portions.

In addition, according to a method of coating a light emitting device, a light coupler, and a method of fabricating a light coupler according to the present disclosure, a phosphor may be economically coated due to the use of only a small amount of the phosphor.

Furthermore, a method of coating a light emitting device, a light coupler, and a method of fabricating a light coupler according to the present disclosure may enable coating of a phosphor and fabrication of a light coupler using a batch process, thereby improving productivity.

BRIEF DESCRIPTION OF DRAWINGS

FIGS. 11A through 11D are diagrams illustrating respective steps of a method of coating a light emitting device according to another exemplary embodiment of the present disclosure.

FIGS. 13A and 13B are diagrams of a light coupler according to an exemplary embodiment of the present disclosure.

FIG. 14 is a plan view of a modified example of the light coupler of FIG. 13, according to an exemplary embodiment of the present disclosure.

FIGS. 15A through 19 are diagrams illustrating a method of fabricating a light coupler according to an exemplary embodiment of the present disclosure.

MODE FOR EMBODYING INVENTION

Figure 1:
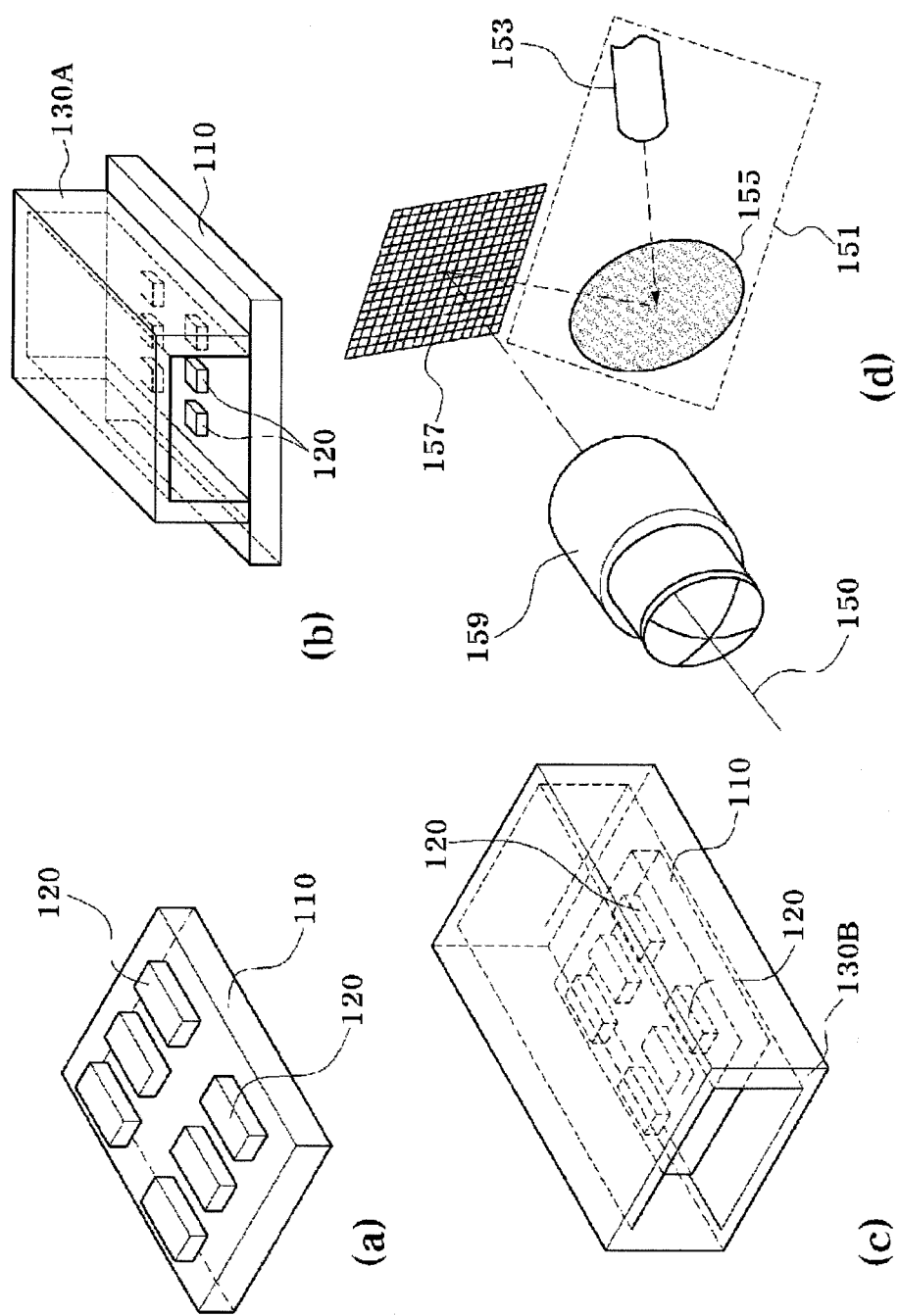
FIGS. 1A through 1D are conceptual diagrams of an example of a microfluidic channel and lithography system required to coat a light emitting device.
Figure 2:
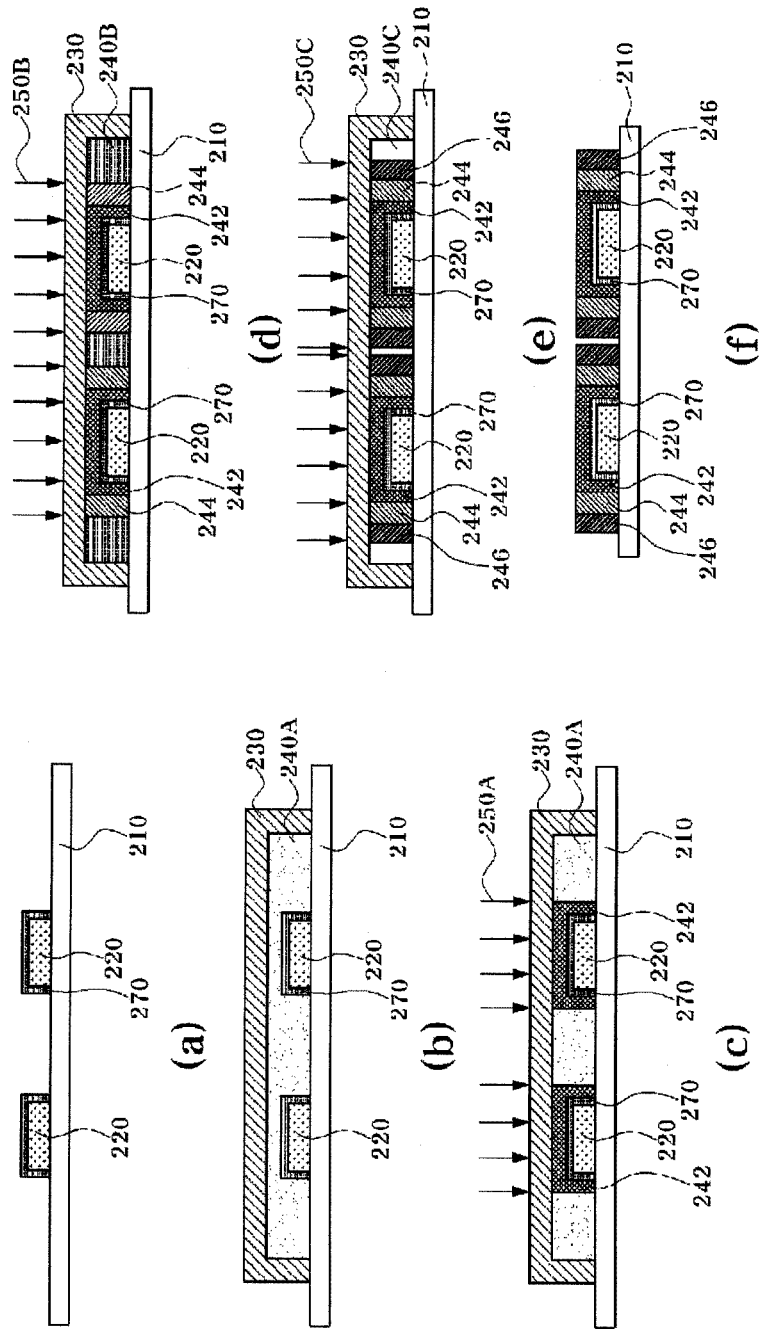
FIGS. 2A through 2F are cross-sectional views illustrating respective steps of a method of coating a light emitting device according to an exemplary embodiment of the present disclosure.

The disclosure is described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the widths, lengths, and lengths of layers and regions may be exaggerated for clarity. It will be understood that the drawings are described from an observer's point of view, and when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout.

FIGS. 1A through 1D are conceptual diagrams of an example of a microfluidic channel and lithography system required to coat an emission device.

FIG. 1A is a perspective view of a plurality of light emitting devices 120 arranged on a substrate 110.

Referring to FIG. 1A, the plurality of light emitting devices 120 may be arranged on the substrate 110. Various kinds of substrates may be used as the substrate 110. The substrate 110 may be, for example, a semiconductor substrate (e.g., a silicon substrate), a glass substrate, a plastic substrate, or a circuit substrate (e.g., a printed circuit board (PCB)). A semiconductor substrate is exemplarily illustrated as the substrate 110 in the drawings. In another embodiment, unlike that shown, the substrate 110 may be a flexible substrate. The flexible substrate may be, for example, a plastic substrate, a plastic film, or a flexible PCB. In some embodiments, when only the plurality of light emitting devices 120 are coated, the substrate 110 may be omitted.

The plurality of light emitting devices 120 may be, for example, light emitting diodes (LEDs). LEDs may be classified according to an emission type, an emission color, and a used material. For example, LEDs may be divided into top-emitting LEDs and side-emitting LEDs according to the emission type. Also, LEDs may be classified into, for example, blue LEDs, red LEDs, green LEDs, yellow LEDs, and ultraviolet (UV) LEDs according to the emission color. Furthermore, LEDs may be categorized into gallium phosphide:zinc oxide (GaP:ZnO) LEDs, GaP:nitrogen(N) LEDs, gallium arsenide (GaAs)-based LEDs, GaAsP-based LEDs, gallium aluminum arsenide (GaAlAs)-based LEDs, indium gallium aluminum phosphide (InGaAlP)-based LEDs, GaN-based LEDs, silicon carbide (SiC)-based LEDs, and Group II-VI LEDs according to the used material.

FIG. 1B is a perspective view of the plurality of light emitting devices 120 arranged within a microfluidic channel 130A.

Referring to FIG. 1B, the substrate 110 and the plurality of light emitting devices 120 are disposed within the microfluidic channel 130A. A space between the microfluidic channel 130A and the substrate 110 is surrounded by the microfluidic channel 130A and the substrate 110.

Various kinds of materials may be used as a material for forming the microfluidic channel 130A. The microfluidic channel 130A may be formed of, for example, a polymer compound (e.g., poly-dimethyl siloxane (PDMS)). Also, the microfluidic channel 130A may further contain a photocurable liquid (not shown) therein. In addition, the microfluidic channel 130A may further include an inlet tube (not shown) and an outlet tube (not shown) to respectively inject and emit the photocurable liquid. In one embodiment, a space between the microfluidic channel 130A and the substrate 110 is surrounded by the microfluidic channel 130A and the substrate 110 and connected to an external space only by the inlet tube and the outlet tube. Furthermore, an inner wall of the microfluidic tube 130A may further include an oxygen-inhibition layer (not shown). The photocurable liquid that contacts the oxygen-inhibition layer is not cured by light (e.g., UV light). Accordingly, the oxygen-inhibition layer functions as an anti-adhesion layer.

The photocurable liquid reacts with light and is cured. Various kinds of materials may be used as the photocurable liquid. For instance, the photocurable liquid may be a mixture of polyethylene glycol (400) diacrylate (PEG-DA available from Polyscience) and a known photoinitiator. In another example, the photocurable liquid may be another known material or mixture cured with irradiation of infrared (IR) or UV light. The photocurable liquid may further include a phosphor. Various kinds of phosphors may be used as the phosphor. The phosphor may be, for example, at least one selected from the group consisting of a red phosphor, a green phosphor, a blue phosphor, a yellow phosphor, and a combination thereof.

FIG. 1C is a perspective view of the plurality of light emitting devices 120 disposed within a microfluidic channel 130B.

Referring to FIG. 1C, the substrate 110 and the plurality of light emitting devices 120 are disposed within the microfluidic channel 130B. The microfluidic channel 130B corresponds to a modified example of the microfluidic channel 130A of FIG. 1B. While one side of the microfluidic channel 130A of FIG. 1B is open, four sides of the microfluidic channel 130B of FIG. 1C are connected to one another and closed. Since materials, constructions, and functions of the microfluidic channel 130 are substantially the same as those of the microfluidic channel 130A except for structural differences therebetween, a detailed description thereof will be omitted for brevity.

FIG. 1D is a diagram of an example of the lithography system, which is a perspective view of a maskless lithography system.

Referring to FIG. 1D, the lithography system includes a light source 151, a spatial light modulator 157, and a demagnification lens 159. Light provided by the light source 151 is modulated by the spatial light modulator 157 and the demagnification lens 159 into light having a programmed pattern (not shown), that is, light 150 having selected characteristics.

The light source 151 serves to provide light capable of curing the photocurable light, which may be further included in the above-described microfluidic channel 130 of FIG. 1B, to the spatial light modulator 157. The light source 151 may be, for example, a UV light source, or may be a visible light source according to the type of the photocurable liquid. The light source 151 may include a UV light source collimator 153 and a UV filter 155. The UV light source collimator 153 functions to output collimated UV light. The UV light source collimator 153 may include, for example, a 200 W UV lamp (not shown) and a fiber-based light-guiding system (not shown). The UV filter 155 functions to selectively provide UV light, out of light provided by the UV light source collimator 153, to the spatial light modulator 157.

The spatial light modulator 157 serves to modulate light provided by the light source 151. FIG. 1D illustrates a digital micromirror array fabricated as a 2-dimensional array type. The spatial light modulator 157 may be fabricated as a 1-dimensional array type unlike that shown, or fabricated using another technique, for example, a liquid crystal display (LCD) technique, instead of a micromirror. A light modulator operation of the spatial light modulator 157 is programmable. That is, the spatial light modulator 157 may selectively transmit light incident to a desired pixel of pixels included in the spatial light modulator 157 to the demagnification lens 159 at a desired time. The light modulation operation of the spatial light modulator 157 may be controlled by, for example, a computer (not shown). Specifically, images generated by the computer are transmitted to the programmable spatial light modulator 157, and the spatial light modulator 157 controls the shape of light exposed to the microfluidic channel 130A.

The demagnification lens 159 demagnifies light modulated by the spatial light modulator 157 and provides the demagnified light to the micro fluidic channel 130A. A microscopic object lens having various magnifications of 2×, 4×, 10×, 20×, 40×, and 60× may be used as the demagnification lens 159. For example, a 10× microscopic object lens may be used as the demagnification lens 159 to project light with a demagnification factor of about 8.9.

Unlike that shown, various methods may be used as a method of selectively exposing light to the microfluidic channel 130A. In another embodiment, a method of selectively exposing light 150 to a photocurable liquid (not shown) may employ a photomask.

FIGS. 2A through 2F are cross-sectional views illustrating respective steps of a method of coating a light emitting device according to an exemplary embodiment of the present disclosure.

Referring to FIG. 2A, a plurality of light emitting devices 220 are prepared. The plurality of light emitting devices 220 may be arranged on a substrate 210. Also, a transmissive layer 270 may be formed on surfaces of the plurality of light emitting devices 220.

The plurality of light emitting devices 220 arranged on the substrate 210 are prepared. Since materials and properties of the substrate 210 and the plurality of light emitting devices 220 are substantially the same as those of the substrate 110 and the plurality of light emitting devices 120 described above with reference to FIGS. 1A through 1D, a description thereof will be omitted for brevity.

Various kinds of materials may be used as the transmissive layer 270. A photocurable material described above with reference to FIG. 1 may be used as a material for forming the transmissive layer 270. The transmissive layer 270 may form an appropriate space between the plurality of light emitting devices 220 and a coating layer (not shown) formed on the plurality of light emitting devices 220. The space functions to protect the coating layer from high heat generated by the plurality of light emitting devices 220.

Referring to FIG. 2B, the plurality of light emitting devices 220 are dipped in a first photocurable liquid 240A using a microfluidic channel 230 containing a first photocurable liquid 240A therein. Thus, the substrate 210 and the plurality of light emitting devices 220 may be coated with the first photocurable liquid 240A. The first photocurable liquid 240A contained in the microfluidic channel 230 may be injected into or emitted from the microfluidic channel 230 in various ways. In an embodiment, the first photocurable liquid 240A may be injected into or emitted from the microfluidic channel 230 through an inlet tube (not shown) and an outlet tube (not shown).

Since materials and properties of the microfluidic channel 230 and the first photocurable liquid 240A are substantially the same as those of the microfluidic channel 130A and the photocurable liquid described above with reference to FIGS. 1A through 1D, a detailed description thereof will be omitted for brevity.

Referring to FIG. 2C, the first photocurable liquid 240A is selectively exposed to light to form a first coating layer 242 on at least a partial region of the surface of the transmissive layer 270. The first coating layer 242 is formed on at least the partial region of the surface of the transmissive layer 270 and corresponds to the cured first photocurable liquid 240A. When the first photocurable liquid 240A contains a phosphor, the first coating layer 242 may also contain the phosphor. The various kinds of phosphors described above with reference to FIG. 1 may be used as the phosphor. Light may be selectively exposed to the first photocurable liquid 240A in various ways. In one embodiment, a method of selectively exposing light to the first photocurable liquid 240A may be a method of exposing first light 250A having selected characteristics to the first photocurable liquid 240A. Specifically, programmed first light 250A may be selectively exposed to the first photocurable liquid 240A using an exposure system capable of programming an optical pattern without a photomask. A method of exposing the first light 250A having selected characteristics to the first photocurable liquid 240A may, for example, employ a spatial light modulator. Since a method of irradiating the first light 250A having the selected characteristics to the first photocurable liquid 240A using the spatial light modulator is substantially the same as the maskless lithography system described above with reference to FIGS. 1A through 1D, a detailed description thereof will be omitted for brevity. In another embodiment, a method of selectively exposing light to the first photocurable liquid 240A may employ a photomask. FIG. 2C exemplarily illustrates that the first light 250A having the selected characteristics is exposed to the first photocurable liquid 240A. The first light 250A may cure the first photocurable liquid 240A to form the first coating layer 242. In this case, the first photocurable liquid 240 serve as negative photoresist. In another embodiment, unlike that shown, the first photocurable liquid 240A may have positive photoresist characteristics. In this case, the first light 250A is selectively exposed to a region other than a region where the first coating layer 242 is formed, thereby forming the first coating layer 242. Also, FIG. 2C exemplarily illustrates that the first coating layer 242 covers the entire surfaces of the plurality of light emitting devices 220. In another embodiment, unlike that shown, a first coating layer may cover portions of surfaces of a plurality of light emitting devices 220.

Referring to FIG. 2D, a second photocurable liquid 240B is provided to the microfluidic channel 230, so that the plurality of light emitting devices 220 on which the first coating layer 242 are formed are dipped in a second photocurable liquid 240B. To form a second coating layer 244 on at least a partial region of a surface of the first coating layer 242, light is selectively exposed to the second photocurable liquid 240B.

Since materials and properties of the second photocurable liquid 240B are substantially the same as those of the first photocurable liquid 240A described above with reference to FIG. 2B, a detailed description thereof will be omitted for brevity.

The second coating layer 244 is formed on at least the partial region of the first coating layer 242 and corresponds to the cured second photocurable liquid 240B. When the second photocurable liquid 240B contains a phosphor, the second coating layer 244 may also contain the phosphor. Various kinds of phosphors described above with reference to FIGS. 1A through 1D may be used as the phosphor. Since a method of selectively exposing light to the second photocurable liquid 240B is substantially the same as the method of selectively exposing light to the first photocurable liquid 240A described above with reference to FIG. 2C, a detailed description thereof will be omitted for brevity. A pattern of the second light 250B having selected characteristics that are obtained using the above-described method may be programmed.

Referring to FIG. 2E, a third photocurable liquid 240C is provided to the microfluidic channel 230, so that the plurality of light emitting devices 220 on which the second coating layer 244 is formed are dipped in a third photocurable liquid 240C. To form a third coating layer 246 on at least a partial region of the second coating layer 244, light is selectively exposed to the third photocurable liquid 240C.

Since materials and properties of the third photocurable liquid 240C are substantially the same as those of the first photocurable liquid 240A described above with reference to FIG. 2B, a detailed description thereof will be omitted for brevity.

The third coating layer 246 is formed on at least the partial region of the surface of the second coating layer 244 and corresponds to the cured third photocurable liquid 240C. When the third photocurable liquid 240C contains a phosphor, the third coating layer 246 may also contain the phosphor. Various kinds of phosphors described above with reference to FIGS. 1A through 1D may be used as the phosphor. Since a method of selectively exposing light to the third photocurable liquid 240C is substantially the same as the method of selectively exposing light to the first photocurable liquid 240A described above with reference to FIG. 2C, a detailed description thereof will be omitted for brevity. A pattern of the third light 250C having selected characteristics that are obtained using the above-described method may be programmed.

Referring to FIG. 2F, the plurality of light emitting devices 220 on which the transmissive layer 270, the first coating layer 242, the second coating layer 244, and the third coating layer 246 are formed are obtained.

Referring back to FIGS. 2A through 2F, the step of forming the third coating layer 246 is included. In another embodiment, the step of forming the third coating layer 246 shown in FIG. 2E may be omitted. In this case, the plurality of light emitting devices 220 include the transmissive layer 270, the first coating layer 242, and the second coating layer 244. Also, FIGS. 2A through 2F exemplarily illustrate that the transmissive layer 270 is formed. In another embodiment, when the first coating layer 242, the second coating layer 244, or the third coating layer 246 has a high heat resistance, the transmissive layer 270 may be omitted. When the above-described photocurable liquid is used as a material for forming the transmissive layer 270, a pattern of the transmissive layer 270 may be formed using the method described above with reference to FIG. 2C. However, the present disclosure is not limited thereto, and the pattern of the transmissive layer 270 may be formed using a known method. In addition, FIGS. 2A through 2F exemplarily illustrate that the plurality of light emitting devices 220 are arranged on the substrate 210. In another embodiment, when only the plurality of light emitting devices 220 are coated, the substrate 210 may be omitted. In another embodiment, the plurality of light emitting devices 220 may further include an additional coating layer (not shown). Furthermore, FIGS. 2A through 2F exemplarily illustrate that the coating layers 242, 244, and 246 are formed on the plurality of light emitting devices 220 using the microfluidic channel 230 with one side open. In another embodiment, the coating layers 242, 244, and 246 may be formed on the plurality of light emitting devices 220 using the microfluidic channel 130B described above with reference to FIG. 1C. Also, FIGS. 2A through 2F exemplarily illustrate that the plurality of light emitting devices 220 are coated with the photocurable liquids 240A, 240B, and 240C using the microfluidic channel 230. In another embodiment, unlike that shown, the plurality of light emitting devices 220 are dipped in the photocurable liquids 240A, 240B, and 240C and withdrawn, so that the plurality of light emitting devices 220 may be coated with the photocurable liquids 240A, 240B, and 240C. In another embodiment, the photocurable liquids 240A, 240B, and 240C may be coated on the plurality of light emitting devices 220 using a spray or spin coating method.

Since a method of coating a light emitting device according to the present disclosure enables the patterning of a coating layer containing a phosphor, the coating layer containing the phosphor may be formed a desired number of times or in desired regions. Also, since the method of coating the light emitting device according to the present disclosure employs a microfluidic channel, the coating layer containing the phosphor may be economically formed using only a small amount of photocurable liquid.

When the first coating layer 242, the second coating layer 244, or the third coating layer 246 contains a phosphor, various colors of light may be embodied by changing the kind of each phosphor and the brightness of light provided by the plurality of light emitting devices 220. In an embodiment, when UV LEDs are used as the plurality of light emitting devices 220, any one of the first through third coating layers 242, 244, and 246 contains a red phosphor, and the remaining ones do not include a phosphor, a red LED may be embodied. In another embodiment, when red LEDs are used as the plurality of light emitting devices 220, any one of the first through third coating layers 242, 244, and 246 includes a green phosphor, and the remaining ones do not include a phosphor, a yellow LED may be embodied. At least two of the first through third coating layers 242, 244, and 246 may include different phosphors. In one embodiment, when UV LEDs are used as the plurality of light emitting devices 220 and the first through third coating layers 242, 244, and 246 include a red phosphor, a green phosphor, and a blue phosphor, respectively, a white LED may be embodied. In another embodiment, blue LEDs may be used as the plurality of light emitting devices 220, and two of the first through third coating layers 242, 244, and 246 may include different phosphors. In this case, when the two of the first through third coating layers 242, 244, and 246 include a red phosphor and a green phosphor, respectively, a white LED may be embodied.

When any one of the first through third coating layers 242, 244, and 246 includes a phosphor, the characteristics of light emitted by the plurality of light emitting devices 220 may depend on the thickness of the coating layer containing the phosphor. In one embodiment, when the thickness of the coating layer containing the phosphor is increased, the intensity of light converted by phosphor increases. In another embodiment, when the thickness of the coating layer containing the phosphor is reduced, the intensity of light converted by phosphor decreases. Accordingly, since the thickness of the coating layer containing the phosphor significantly affects color finally obtained by the plurality of light emitting devices 220, the thickness of the coating layer containing the phosphor should be precisely controllable. In particular, since light is emitted not only from top surfaces of the plurality of light emitting devices 220 but also from lateral surfaces thereof, not only the thickness of the coating layer containing the phosphor disposed on the top surfaces of the plurality of light emitting devices 220 but also the thickness of the coating layer containing the phosphor disposed on the lateral surfaces thereof should be precisely controllable.

Figure 3:
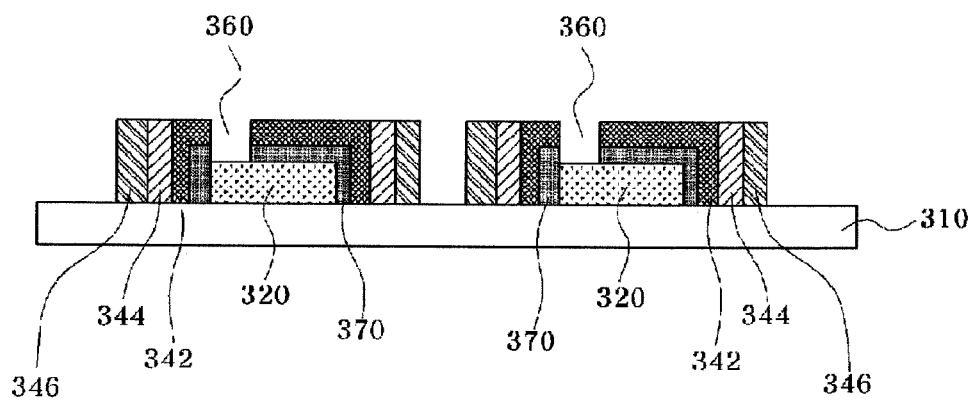
FIGS. 3 through 5 are cross-sectional views of various coating layers formed on surfaces of a plurality of light emitting devices using the method of coating the light emitting device according to an exemplary embodiment as shown in FIGS. 2A through 2F.
Figure 4:
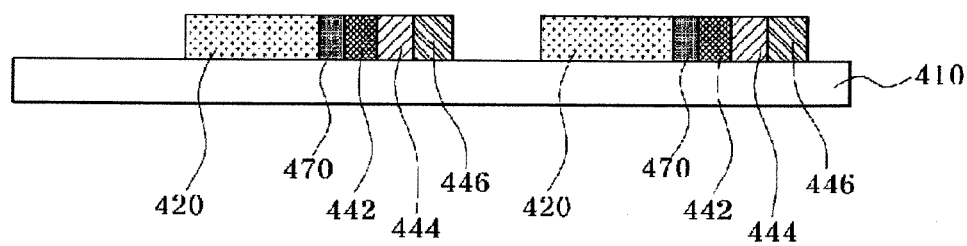
Figure 5:
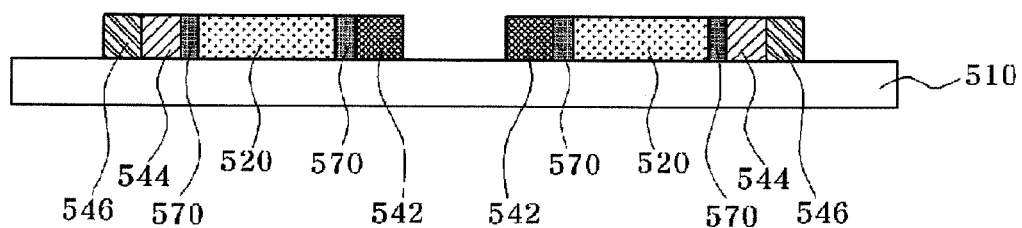

FIGS. 3 through 5 are cross-sectional views of various coating layers formed on surfaces of a plurality of light emitting devices using the method of coating the light emitting device shown in FIGS. 2A through 2F.

Referring to FIG. 3, a partial region 360 of a top surface of each of a plurality of light emitting devices 320, which is required for a contact with a bonding wire, is not covered with a transmissive layer 370, a first coating layer 342, a second coating layer 344, and a third coating layer 346. The partial region 360 required for the contact with the bonding wire may be formed using the method of programming the optical pattern described above with reference to FIGS. 2A through 2F. In another embodiment, the partial region 360 required for the contact with the bonding wire may be formed using a photomask. Since the partial region 360 required for the contact with the bonding wire may be formed, the plurality of light emitting devices 220 may be simultaneously coated and then bonded using wires after the coating process, a batch process may be enabled to improve productivity.

FIG. 3 exemplarily illustrates that the plurality of light emitting devices 320 are arranged on a substrate 310. In another embodiment, when only the plurality of light emitting devices 320 are coated, the substrate 310 may be omitted. Also, FIG. 3 illustrates that the third coating layer 346 is included. In another embodiment, the third coating layer 346 may be omitted. In this case, the plurality of light emitting devices 320 may include the transmissive layer 370, the first coating layer 342, and the second coating layer 344. In addition, FIG. 3 illustrates that the transmissive layer 370 is formed. In another embodiment, when the first coating layer 342, the second coating layer 344, or the third coating layer 346 has a high heat resistance, the transmissive layer 370 may be omitted. In another embodiment, the plurality of light emitting devices 320 may further include an additional coating layer (not shown).

Since materials and properties of the substrate 310, the plurality of light emitting devices 320, the transmissive layer 370, the first coating layer 342, the second coating layer 344, and the third coating layer 346 are substantially the same as those of the substrate 210, the plurality of light emitting devices 220, the transmissive layer 270, the first coating layer 242, the second coating layer 244, and the third coating layer 246 described above with reference to FIGS. 2A through 2F, a description thereof will be omitted.

Referring to FIG. 4, the transmissive layer 470, the first coating layer 442, the second coating layer 444, and the third coating layer 446 may be formed on any one lateral surface of each of the plurality of light emitting devices 420. The transmissive layer 470 and the first through third coating layers 442, 444, and 446 may be formed on only one lateral surface of each of the plurality of light emitting devices 420 using the method of programming the optical pattern described above with reference to FIGS. 2A through 2F. In another embodiment, the first through third coating layers 442, 444, and 446 may be formed using a photomask.

FIG. 4 exemplarily illustrates that the plurality of light emitting devices 420 are arranged on the substrate 410. In another embodiment, when only the plurality of light emitting devices 420 are coated, the substrate 410 may be omitted. Also, FIG. 4 illustrates that the third coating layer 446 is included. In another embodiment, the third coating layer 446 may be omitted. In this case, the plurality of light emitting devices 420 may be coated with the transmissive layer 470 and the first and second coating layers 442 and 444. Also, FIG. 4 exemplarily illustrates that the transmissive layer 470 is formed. In another embodiment, when the first coating layer 442, the second coating layer 444, or the third coating layer 446 has a high heat resistance, the transmissive layer 470 may be omitted. In another embodiment, the plurality of light emitting devices 420 may further include an additional coating layer (not shown).

Since materials and properties of the substrate 410, the plurality of light emitting devices 470, the first coating layer 442, the second coating layer 444, and the third coating layer 446 are substantially the same as those of the substrate 210, the plurality of light emitting devices 220, the transmissive layer 270, the first coating layer 242, the second coating layer 244, and the third coating layer 246 described above with reference to FIGS. 2A through 2F, a description thereof will be omitted.

Referring to FIG. 5, a transmissive layer 570 and a first coating layer 542 may be formed on any one lateral surface of each of a plurality of light emitting devices 420, and the transmissive layer 570, a second coating layer 544, and a third coating layer 546 may be formed on the other lateral surface of each of the plurality of light emitting devices 420. The transmissive layer 570 and the first through third coating layers 542, 544, and 546 may be selectively formed on any one lateral surface and the other lateral surface of each of the plurality of light emitting devices 520 using the method of programming the optical pattern described with reference to FIGS. 2A through 2F. In another embodiment, the transmissive layer 570 and the first through third coating layers 542, 544, and 546 may be formed using a photomask.

FIG. 5 exemplarily illustrates that the plurality of light emitting devices 520 are arranged on the substrate 510. In another embodiment, when only the plurality of light emitting devices 520 are coated, the substrate 510 may be omitted. Also, FIG. 5 illustrates that the third coating layer 546 is included. In another embodiment, the third coating layer 546 may be omitted. In this case, the plurality of light emitting devices 520 may be coated with the transmissive layer 570 and the first and second coating layers 542 and 544. Also, FIG. 5 exemplarily illustrates that the transmissive layer 570 is formed. In another embodiment, when the first coating layer 542, the second coating layer 544, or the third coating layer 546 has a high heat resistance, the transmissive layer 570 may be omitted. In another embodiment, the plurality of light emitting devices 520 may further include an additional coating layer (not shown).

Since materials and properties of the substrate 510, the plurality of light emitting devices 520, the transmissive layer 570, the first coating layer 542, the second coating layer 544, and the third coating layer 546 are substantially the same as those of the substrate 210, the plurality of light emitting devices 220, the transmissive layer 270, the first coating layer 242, the second coating layer 244, and the third coating layer 246 described above with reference to FIGS. 2A through 2F, a description thereof will be omitted.

Figure 6:
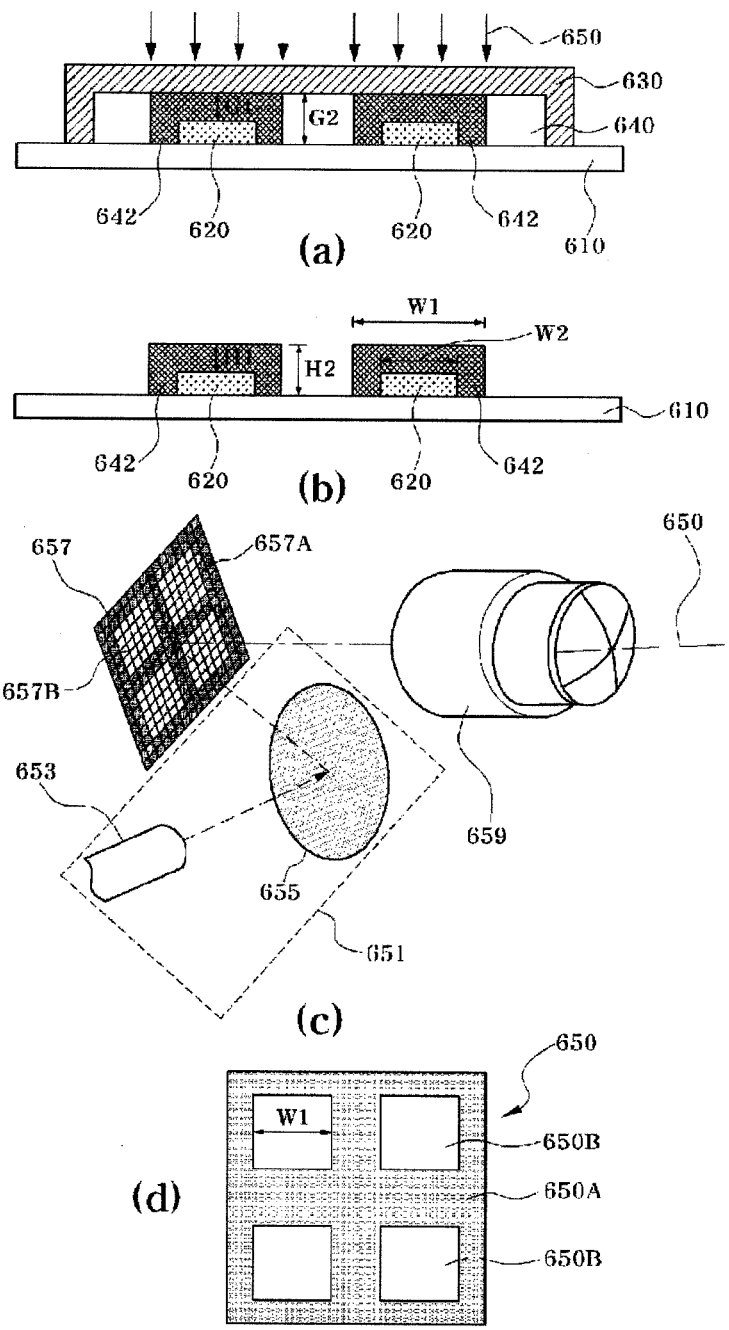
FIGS. 6A through 6D are diagrams for explaining that the shape and thickness of a coating layer formed on a plurality of light emitting devices may be controlled according to the shapes of a microfluidic channel and an optical pattern.
Figure 7:
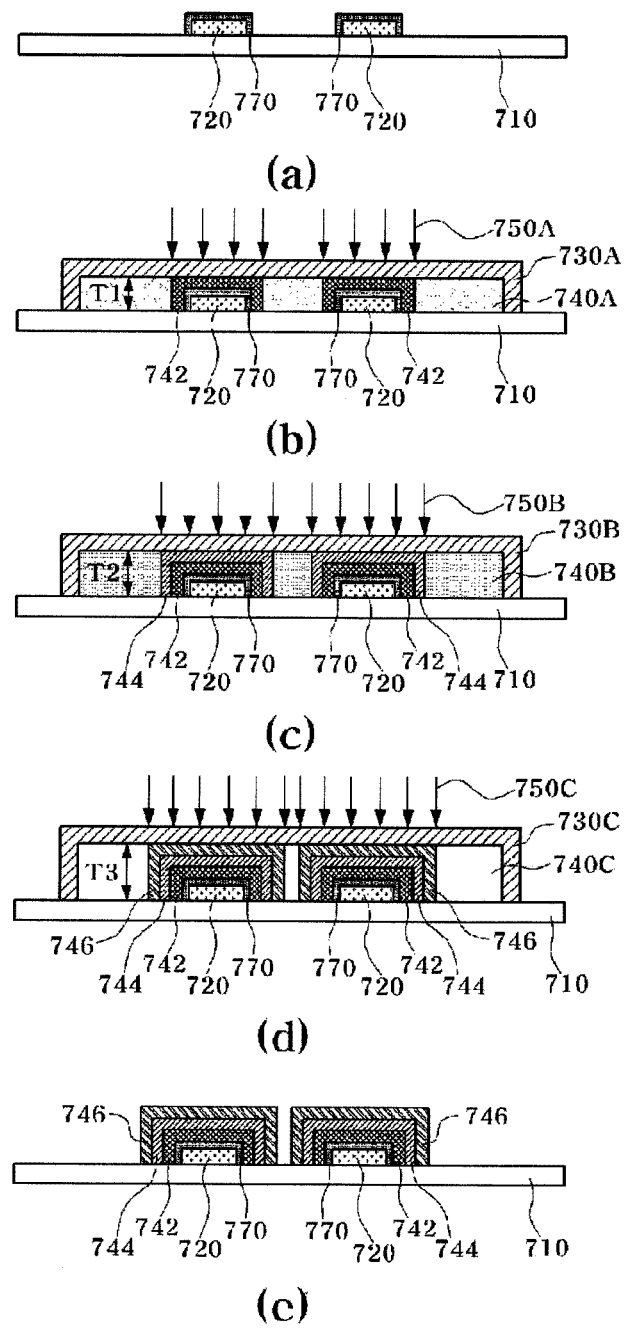
FIGS. 7A through 7E are cross-sectional views illustrating respective steps of a method of coating a light emitting device according to another exemplary embodiment of the present disclosure.

FIGS. 6A through 6D are diagrams for explaining that the shape and thickness of a coating layer formed on a plurality of light emitting devices may be controlled according to the shapes of a microfluidic channel and an optical pattern. FIG. 6A illustrates that light is selectively exposed to a photocurable liquid, and FIG. 6B illustrates a coating layer formed on surfaces of the plurality of light emitting devices. FIGS. 6A and 6B are cross-sectional views. Also, FIG. 6C is a conceptual diagram of an exposure system capable of programming an optical pattern without a photomask, and FIG. 6D illustrates light having selected characteristics obtained using the exposure system. FIG. 6C is a perspective view, and FIG. 6D is a plan view.

Referring to FIGS. 6A and 6B, the thickness of a coating layer 642 disposed on a top surface of each of the plurality of light emitting devices 620 may be determined by a distance between an inner lateral surface of a microfluidic channel 630 and the top surface of each of the plurality of light emitting devices 620. In one embodiment, assuming that a photocurable liquid 640 neither expands nor contracts during a curing process, a thickness H1 of the coating layer 642 corresponds to a distance G1 between the inner lateral surface of the microfluidic channel 630 and the top surface of each of the plurality of light emitting devices 620. Also, the width of the coating layer 642 disposed on a lateral surface of each of the plurality of light emitting devices 620 may be determined by a distance between an edge of a pattern of light 650 having selected characteristics and an edge of each of the plurality of light emitting devices 620. In one embodiment, assuming that the photocurable liquid 640 neither expands nor contracts during the curing process, the width of the coating layer 642 may be obtained from a distance between a width W1 of the pattern of the light 650 having the selected characteristics and a width W2 of each of the plurality of light emitting devices 620. Accordingly, when the plurality of light emitting devices 620 are coated according to the present disclosure, the thickness and width of the coating layer 642 may be easily controlled. That is, since the method of coating the light emitting device according to the present disclosure may easily control the thickness and width of the coating layer containing the phosphor, the phosphor can be uniformly coated.

Referring to FIGS. 6C and 6D, a lithography system configured to embody the light 650 having the selected characteristics includes a light source 651, a spatial light modulator 657, and a demagnification lens 659. Since structures and functions of the light source 651, the spatial light modulator 657, and the demagnification lens 659 are substantially the same as those of the light source 151, the spatial light modulator 157, and the demagnification lens 159 described above with reference to FIGS. 1A through 1D, a detailed description thereof will be omitted. FIGS. 6C and 6D exemplarily illustrate that the spatial light modulator 657 is a digital micromirror array fabricated as a 2-dimensional array type. The micromirror array 657 may control the tilt of each mirror constituting the micromirror array 657 to obtain a pattern with a predetermined shape. In one embodiment, some mirrors 657A of mirrors constituting the micromirror array 657 may cut off light provided by the light source 651, while some mirrors 657B of the remaining mirrors may provide the light transmitted by the light source 651 through the demagnification lens 659 to the microfluidic channel 630. The light 650 provided to the microfluidic channel 630 may be divided into a region 650B where the light of the light source 651 is transmitted and a region 650A where the light of the light source 651 is cut off. That is, selected light having a width W1 may be provided by the micromirror array 657 and the demagnification lens 659 to the microfluidic channel 630.

Referring back to FIGS. 6A and 6B, it is exemplarily illustrated that the coating layer 642 is formed on the plurality of light emitting devices 620 using the microfluidic channel 630 with one side open. In another embodiment, the coating layer 642 may be formed on the plurality of light emitting devices 620 using the microfluidic channel 130B described above with reference to FIG. 1C. The thickness and width of the coating layer 642 may be controlled in the above-described manner.

FIGS. 7A through 7E are cross-sectional views illustrating respective steps of a method of coating a light emitting device according to another exemplary embodiment of the present disclosure.

Referring to FIG. 7A, a plurality of light emitting devices 720 are prepared. The plurality of light emitting devices 720 may be arranged on a substrate 710. Also, a transmissive layer 770 may be formed on surfaces of the plurality of light emitting devices 720.

Referring to FIG. 7B, the plurality of light emitting devices 720 are dipped in a first photocurable liquid 740A using a first microfluidic channel 730A containing the first photocurable liquid 740A therein. To form a first coating layer 742 on at least a partial region of a surface of the transmissive layer 770, light is selectively exposed to the first photocurable liquid 740A.

There is a distance T1 between an inner lateral surface of the first microfluidic channel 730A and a top surface of the substrate 710. By controlling the distance T1, the thickness of the first coating layer 742 formed on the plurality of light emitting devices 720 may be controlled. The first photocurable liquid 740A may further include a phosphor.

The first coating layer 742 is formed on at least the partial region of the surface of the transmissive layer 770 and corresponds to the cured first photocurable liquid 740A. When the first photocurable liquid 740A contains a phosphor, the first coating layer 742 may also contain the phosphor. Since a method of selectively exposing light to the first photocurable liquid 740A is substantially the same as the method of selectively exposing light to the first photocurable liquid 240A described above with reference to FIG. 2C, a detailed description thereof will be omitted. A pattern of the first light 750A having selected characteristics that are obtained using the above-described method may be programmed. Accordingly, the width and thickness of the first coating layer 742 may be controlled using the method described with reference to FIG. 6.

Referring to FIG. 7C, a second photocurable liquid 740B is provided to a microfluidic channel 730B, so that the plurality of light emitting devices 720 on which the first coating layer 742 are formed are dipped in a second photocurable liquid 740B. To form a second coating layer 744 on at least a partial region of a surface of the first coating layer 742, light is selectively exposed to the second photocurable liquid 740B.

There is a distance T2 between an inner lateral surface of the second microfluidic channel 730B and the top surface of the substrate 710. By controlling the distance T2, the thickness of the second coating layer (744) formed on the plurality of light emitting devices 720 may be controlled. The second photocurable liquid 740B may further include a phosphor.

The first coating layer 744 is formed on at least the partial region of the surface of the first coating layer 742 and corresponds to the cured second photocurable liquid 740B. When the second photocurable liquid 740B contains a phosphor, the second coating layer 744 may also contain the phosphor. Since a method of selectively exposing light to the first photocurable liquid 740B is substantially the same as the method of selectively exposing light to the first photocurable liquid 240A described above with reference to FIG. 2C, a detailed description thereof will be omitted. A pattern of the second light 750B having selected characteristics that are obtained using the above-described method may be programmed. Accordingly, the width and thickness of the second coating layer 744 may be controlled using the method described with reference to FIG. 6.

Referring to FIG. 7D, a third photocurable liquid 740C is provided to a microfluidic channel 730C, so that the plurality of light emitting devices 720 on which the second coating layer 744 are formed are dipped in a third photocurable liquid 740C. To form a third coating layer 746 on at least a partial region of a surface of the second coating layer 744, light is selectively exposed to the third photocurable liquid 740C.

There is a distance T3 between an inner lateral surface of the third microfluidic channel 730C and the top surface of the substrate 710. By controlling the distance T3, the thickness of the third coating layer (746) formed on the plurality of light emitting devices 720 may be controlled. The third photocurable liquid 740C may further include a phosphor.

The third coating layer 746 is formed on at least the partial region of the surface of the second coating layer 744 and corresponds to the cured third photocurable liquid 740C. When the third photocurable liquid 740C contains a phosphor, the third coating layer 746 may also contain the phosphor. Since a method of selectively exposing light to the third photocurable liquid 740C is substantially the same as the method of selectively exposing light to the first photocurable liquid 240A described above with reference to FIG. 2C, a detailed description thereof will be omitted. A pattern of the third light 750C having selected characteristics that are obtained using the above-described method may be programmed. Accordingly, the width and thickness of the third coating layer 746 may be controlled using the method described with reference to FIG. 6.

Referring to FIG. 7E, the plurality of light emitting devices 720 on which the transmissive layer 770, the first coating layer 742, the second coating layer 744, and the third coating layer 746 are formed are obtained.

Since materials and properties of the substrate 710, the plurality of light emitting devices 720, the transmissive layer 770, the microfluidic channels 730A, 730B, and 730C and the photocurable liquids 740A, 740B, and 740C are substantially the same as those of the substrate 210, the plurality of light emitting devices 220, the transmissive layer 270, the microfluidic channel 230, and the photocurable liquids 240A, 240B, and 240C, a detailed description thereof will be omitted.

Referring back to FIGS. 7A through 7E, the height and width of a coating layer coated on the plurality of light emitting devices 770 may be controlled using a plurality of microfluidic channels having different heights. The method of coating the light emitting device described above with reference to FIGS. 2A through 2F differs from the method of the present embodiment in that light is selectively exposed so that although the width of a coating layer may be controlled, the height of a microfluidic channel is fixed to fix the height of the coating layer. In FIGS. 7A through 7E, the step of forming the third coating layer 746 is included. In another embodiment, the step of forming the third coating layer 746 shown in FIG. 7D may be omitted. In this case, the plurality of light emitting devices 720 include the transmissive layer 770, the first coating layer 742, and the second coating layer 744. Also, FIGS. 7A through 7E exemplarily illustrate that the transmissive layer 770 is formed. In another embodiment, when the first coating layer 742, the second coating layer 744, or the third coating layer 746 has a high heat resistance, the transmissive layer 770 may be omitted. When the above-described photocurable liquid is used as a material for forming the transmissive layer 770, a pattern of the transmissive layer 770 may be formed using the method described above with reference to FIG. 2C. However, the present disclosure is not limited thereto, and the pattern of the transmissive layer 770 may be formed using a known method. In addition, FIGS. 7A through 7E exemplarily illustrate that the plurality of light emitting devices 720 are arranged on the substrate 710. In another embodiment, when only the plurality of light emitting devices 720 are coated, the substrate 710 may be omitted. In another embodiment, the plurality of light emitting devices 720 may further include an additional coating layer (not shown). In another embodiment, a partial region (not shown) of a top surface of each of the plurality of light emitting devices 720, which is required for a contact with a bonding wire, may not be covered with the transmissive layer 770, the first coating layer 742, the second coating layer 744, and the third coating layer 746. The partial region (not shown) required for the contact with the bonding wire may be formed using the method of programming the optical pattern described above with reference to FIGS. 2A through 2F. FIGS. 7A through 7E exemplarily illustrate that the plurality of light emitting devices 720 are coated with the photocurable liquids 740A, 740B, and 740C using the microfluidic channels 730A, 730B, and 730C. In another embodiment, unlike that shown, the plurality of light emitting devices 720 may be coated with the photocurable liquids 740A, 740B, and 740C using various methods described with reference to FIGS. 2A through 2F.

Figure 8:
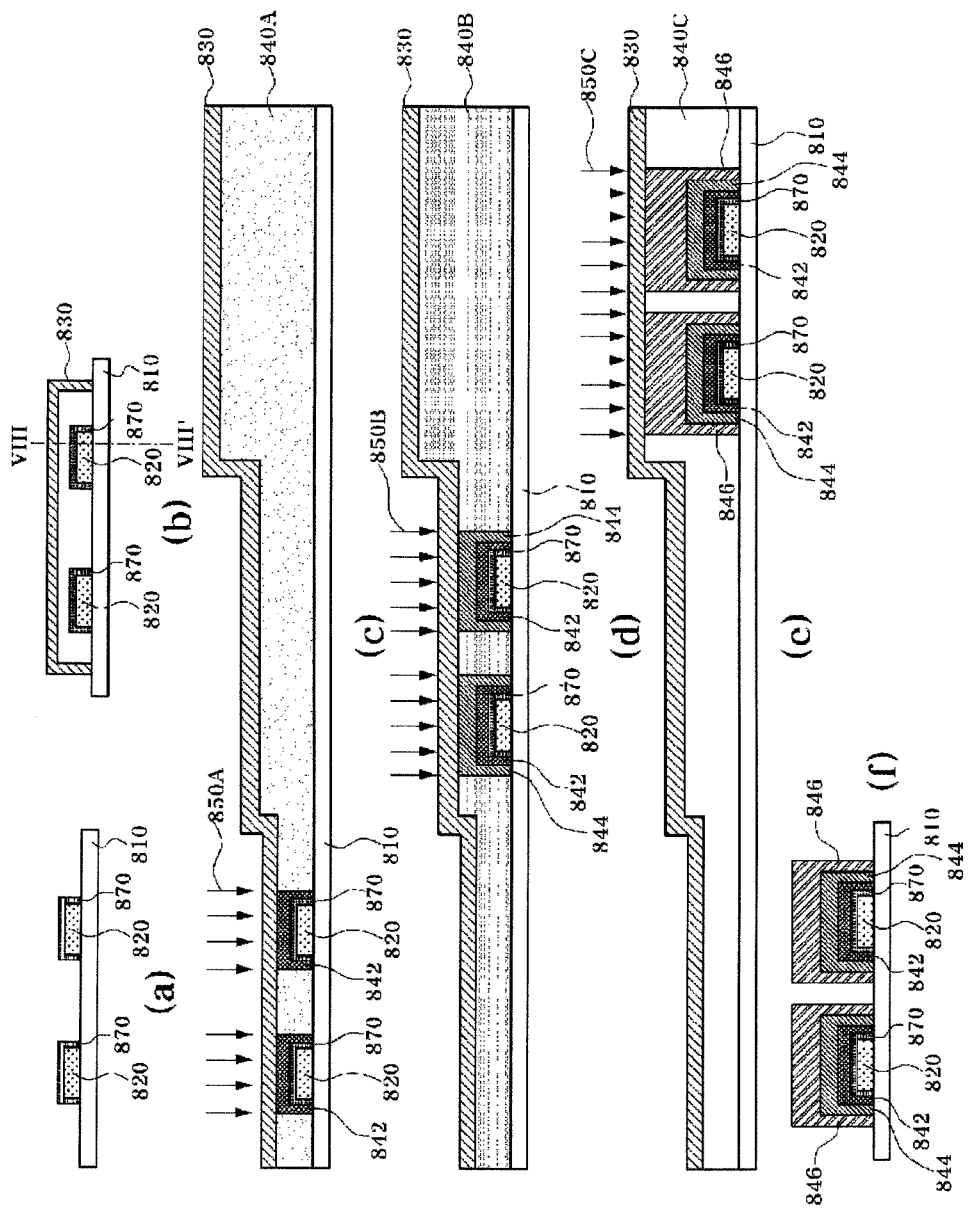
FIGS. 8A through 8F are cross-sectional views illustrating respective steps of a method of coating a light emitting device according to another exemplary embodiment of the present disclosure.

FIGS. 8A through 8F are cross-sectional views illustrating respective steps of a method of coating a light emitting device according to another exemplary embodiment of the present disclosure. FIGS. 8C, 8D, and 8E are cross-sectional views taken along line VIII-VIII' of FIG. 8B.

Referring to FIG. 8A, a plurality of light emitting devices 820 are prepared. The plurality of light emitting devices 820 may be arranged on a substrate 810. In one embodiment, the plurality of light emitting devices 820 may optionally further include a transmissive layer 870.

Referring to FIG. 8B, the plurality of light emitting devices 820 are disposed within a microfluidic channel 830.

Referring to FIG. 8C, a plurality of light emitting devices 820 are dipped in a first photocurable liquid 840A using the microfluidic channel 830 through which the first photocurable liquid 840A flows. First light 850A is selectively exposed to the first photocurable liquid 840A, so that a first coating layer 842 may be formed on at least a partial region of a surface of the transmissive layer 870. The first coating layer 842 corresponds to the cured first photocurable liquid 840A. The first photocurable liquid 840A may further contain a phosphor.

The microfluidic channel 830 may include a plurality of microfluidic channels with different inner heights, which are connected in series to one another. The substrate 810 and the plurality of light emitting devices 820 may be disposed within any one of the plurality of microfluidic channels of the microfluidic channel 830.

Since a method of selectively exposing light to the first photocurable liquid 840A is substantially the same as the method of selectively exposing light to the first photocurable liquid 240A described above with reference to FIG. 2C, a detailed description thereof will be omitted for brevity. A pattern of the first light 850A having selected characteristics which is obtained using the above-described method may be programmed. Accordingly, the width and thickness of the first coating layer 842 may be controlled using the method described with reference to FIG. 6.

Referring to FIG. 8D, the plurality of light emitting devices 820 on which the first coating layer 842 is formed are disposed within another of the plurality of microfluidic channels of the microfluidic channel 830.

A second photocurable liquid 840B is provided to the inside of the microfluidic channel 830. Second light 850B is selectively exposed to the second photocurable liquid 840B, so that a second coating layer 844 may be formed on at least a partial region of a surface of the first coating layer 842. The second coating layer 844 corresponds to the cured second photocurable liquid 840B. The second photocurable liquid 840B may further include a phosphor.

Since a method of selectively exposing light to the second photocurable liquid 840B is substantially the same as the method of selectively exposing light to the first photocurable liquid 240A described above with reference to FIG. 2C, a detailed description thereof will be omitted for brevity. A pattern of the second light 850B having selected characteristics which is obtained using the above-described method may be programmed. Accordingly, the width and thickness of the second coating layer 844 may be controlled using the method described with reference to FIG. 6.

Referring to FIG. 8E, the plurality of light emitting devices 820 on which the second coating layer 844 is formed are disposed within another of the plurality of microfluidic channels of the microfluidic channel 830.

A third photocurable liquid 840C is provided to the inside of the microfluidic channel 830. Third light 850C is selectively exposed to the third photocurable liquid 840C, so that a third coating layer 846 may be formed on at least a partial region of a surface of the second coating layer 844. The third coating layer 846 is formed on at least the partial region of the surface of the second coating layer 844 and corresponds to the cured third photocurable liquid 840C. When the third photocurable liquid 840C contains a phosphor, the third coating layer 846 may also contain the phosphor.

Since a method of selectively exposing light to the third photocurable liquid 840C is substantially the same as the method of selectively exposing light to the first photocurable liquid 240A described above with reference to FIG. 2C, a detailed description thereof will be omitted for brevity. A pattern of the third light 850C having selected characteristics which is obtained using the above-described method may be programmed. Accordingly, the width and thickness of the third coating layer 846 may be controlled using the method described with reference to FIG. 6.

Referring to FIG. 8F, the plurality of light emitting devices 820 on which the transmissive layer 870, the first coating layer 842, the second coating layer 844, and the third coating layer 846 are formed are obtained.

Since materials and properties of the substrate 810, the plurality of light emitting devices 820, the transmissive layer 870, the microfluidic channel 830, and the photocurable liquids 840A, 840B, and 840C are substantially the same as those of the substrate 210, the plurality of light emitting devices 220, the transmissive layer 270, the microfluidic channel 230, and the photocurable liquids 240A, 240B, and 240C described with reference to FIGS. 2A through 2F, a detailed description thereof will be omitted for brevity.

Referring back to FIGS. 8A through 8F, by use of the microfluidic channel 830 including the plurality of microfluidic channels having the inner pipes with different heights, which are connected in series to one another, the height and width of a coating layer coated on the plurality of light emitting devices 870 may be controlled. The method of coating the light emitting device described above with reference to FIGS. 2A through 2F differs from the method of the present embodiment in that light is selectively exposed so that although the width of a coating layer may be controlled, the height of a microfluidic channel is fixed to fix the height of the coating layer. Also, the method of coating the light emitting device described with reference to FIGS. 7A through 7E differs from the method of the present embodiment in that the height of a coating layer may be controlled by changing the microfluidic channels having different heights.

In FIGS. 8A through 8F, the step of forming the third coating layer 846 is included. In another embodiment, the step of forming the third coating layer 846 shown in FIG. 8D may be omitted. In this case, the plurality of light emitting devices 820 may be coated with the transmissive layer 870, the first coating layer 842, and the second coating layer 844. Also, FIGS. 8A through 8F exemplarily illustrate that the transmissive layer 870 is formed. In another embodiment, when the first coating layer 842, the second coating layer 844, or the third coating layer 846 has a high heat resistance, the transmissive layer 870 may be omitted. When the above-described photocurable liquid is used as a material for forming the transmissive layer 870, a pattern of the transmissive layer 870 may be formed using the method described above with reference to FIG. 2C. However, the present disclosure is not limited thereto, and the pattern of the transmissive layer 870 may be formed using a method well known to a person having ordinary skill in the art. In addition, FIGS. 8A through 8E exemplarily illustrate that the plurality of light emitting devices 820 are arranged on the substrate 810. In another embodiment, when only the plurality of light emitting devices 820 are coated, the substrate 810 may be omitted. In another embodiment, the plurality of light emitting devices 820 may further include an additional coating layer (not shown). In another embodiment, a partial region (not shown) of a top surface of each of the plurality of light emitting devices 820, which is required for a contact with a bonding wire, may not be covered with the transmissive layer 870, the first coating layer 842, the second coating layer 844, and the third coating layer 846. The partial region (not shown) required for the contact with the bonding wire may be formed using the method of programming the optical pattern described above with reference to FIGS. 2A through 2F. FIGS. 8A through 8E exemplarily illustrate that the plurality of light emitting devices 820 are coated with the photocurable liquids 840A, 840B, and 840C using the microfluidic channel 830. In another embodiment, unlike that shown, the plurality of light emitting devices 820 may be coated with the photocurable liquids 840A, 840B, and 840C using various methods described with reference to FIGS. 2A through 2F.

Figure 9:
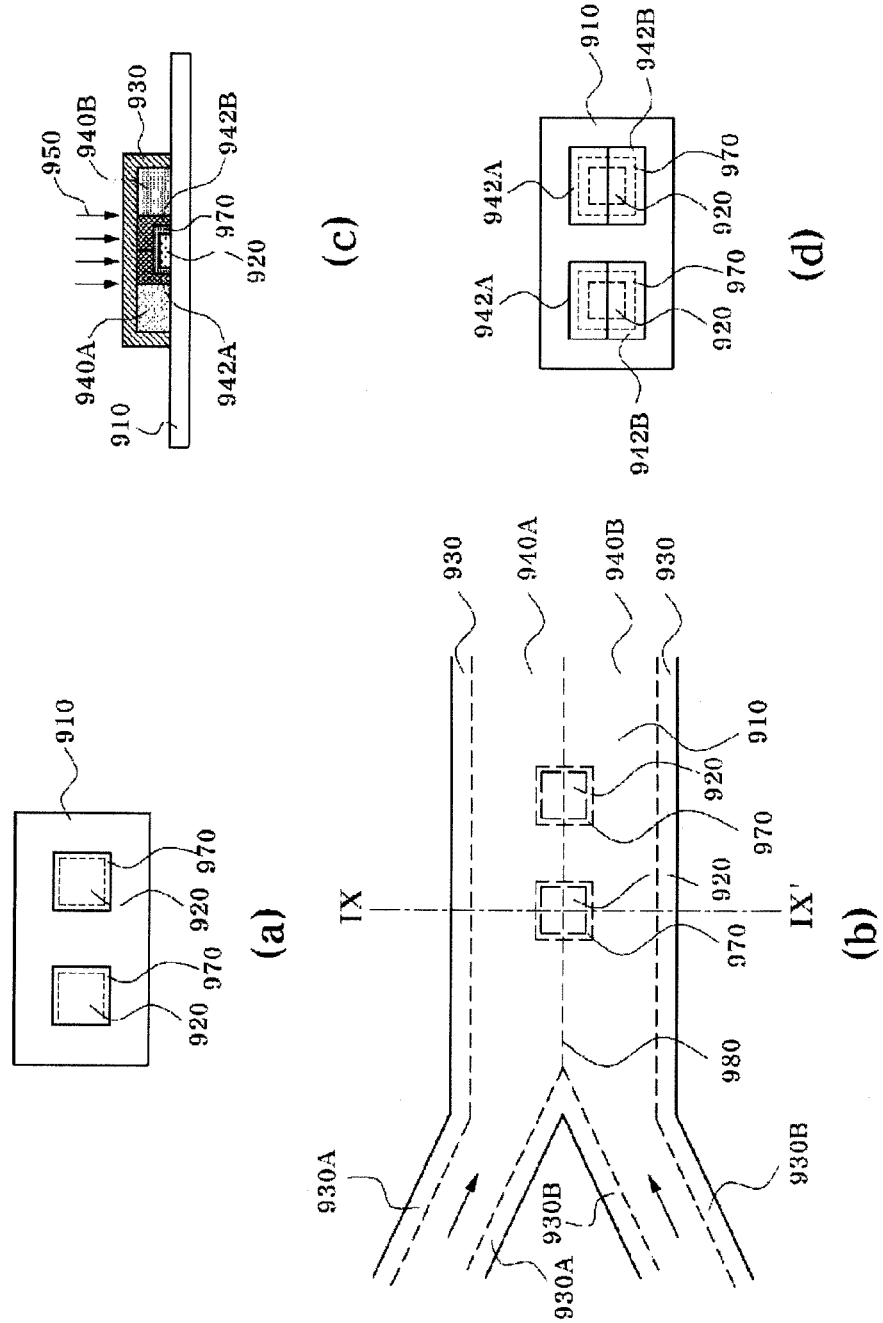
FIGS. 9A through 9D are diagrams illustrating respective steps of a method of coating a light emitting device according to another exemplary embodiment of the present disclosure.

FIGS. 9A through 9D are diagrams illustrating respective steps of a method of coating a light emitting device according to another exemplary embodiment of the present disclosure. FIGS. 9A, 9B, and 9D are plan views, and FIG. 9C is a cross-sectional view taken along line IX-IX' of the plan view of FIG. 9B.

Referring to FIG. 9A, a plurality of light emitting devices 920 are prepared. The plurality of light emitting devices 920 may be arranged on a substrate 910. For example, the plurality of light emitting devices 920 may be side-emitting LEDs. In one embodiment, the plurality of light emitting devices 920 may optionally further include a transmissive layer 970.

Referring to FIG. 9B, the plurality of light emitting devices 920 are dipped in a plurality of photocurable liquids 940A and 940B using a microfluidic channel 930 having branch channels 930A and 930B formed at one end thereof. The photocurable liquids 940A and 940B are injected into the microfluidic channel 930 through the branch channels 930A and 930B and flow through the microfluidic channel 930 to form an interface 980 therebetween. Surfaces of the plurality of light emitting devices 920 are covered with the photocurable liquid 940A and the photocurable liquid 940B across the interface 980. FIG. 9B illustrates that the photocurable liquid 940A and the photocurable liquid 940B flow in the same direction. In another embodiment, the photocurable liquids 940A and 940B may flow in different directions. For example, the photocurable liquid 940A may flow from right to left unlike that shown.

Referring to FIG. 9C, light 950 is selectively exposed to the photocurable liquids 940A and 940B so that coating layers 942A and 942B may be formed on at least a partial region of a surface of the transmissive layer 970. The coating layer 942A and the coating layer 942B correspond to the cured photocurable liquid 940A and the cured photocurable liquid 940B, respectively. In one embodiment, each of the photocurable liquids 940A and 940B may further include a phosphor. Phosphors included in the photocurable liquids 940A and 940B may be phosphors having different properties (e.g., different colors).

Since a method of selectively exposing light 950 to the photocurable liquids 940A and 940B is substantially the same as the method of selectively exposing light to the first photocurable liquid 240A described above with reference to FIG. 2C, a detailed description thereof will be omitted for brevity. A pattern of the first light 950 having selected characteristics which is obtained using the above-described method may be programmed. Accordingly, the width and thickness of the coating layer 942A and 942B may be controlled using the method described with reference to FIG. 6.

Referring to FIG. 9D, the plurality of light emitting devices 920 on which the transmissive layer 970, the coating layer 942A, and the coating layer 942B are formed are obtained.

The coating layer 942A and the coating layer 942B are formed on at least the partial region of the surface of the transmissive layer 970 and correspond to the cured photocurable liquids 940A and 940B. When each of the photocurable liquids 940A and 940B contains a phosphor, each of the coating layers 942A and 942B may also contain the phosphor.

Since materials and properties of the substrate 910, the plurality of light emitting devices 920, the transmissive layer 970, the microfluidic channel 930, and the photocurable liquids 940A and 940B are substantially the same as those of the substrate 210, the plurality of light emitting devices 220, the transmissive layer 270, the microfluidic channel 230, and the photocurable liquids 240A, 240B, and 240C described with reference to FIGS. 2A through 2F, a detailed description thereof will be omitted for brevity.

Referring back to FIGS. 9A through 9D, the height and width of a coating layer coated on the plurality of light emitting devices 920 may be controlled using fluidic channels having different heights. The microfluidic channels having the different heights may be the microfluidic channels described above with reference to FIGS. 7A through 7E and 8A through 8F. FIGS. 9A through 9E exemplarily illustrate that the transmissive layer 970 is formed. In another embodiment, when the coating layer 942A and the coating layer 942B have a high heat resistance, the transmissive layer 970 may be omitted. When the above-described photocurable liquid is used as a material for forming the transmissive layer 970, a pattern of the transmissive layer 970 may be formed using the method described above with reference to FIG. 2C. However, the present disclosure is not limited thereto, and the pattern of the transmissive layer 970 may be formed using a method well known to a person having ordinary skill in the art. In addition, FIGS. 9A through 9E exemplarily illustrate that the plurality of light emitting devices 920 are arranged on the substrate 910. In another embodiment, when only the plurality of light emitting devices 920 are coated, the substrate 910 may be omitted. In another embodiment, the plurality of light emitting devices 920 may further include an additional coating layer (not shown). In another embodiment, a partial region (not shown) of a top surface of each of the plurality of light emitting devices 920, which is required for a contact with a bonding wire, may not be covered with the transmissive layer 970, the coating layer 942A, and the coating layer 942B. The partial region (not shown) required for the contact with the bonding wire may be formed using the method of programming the optical pattern described above with reference to FIGS. 2A through 2F.

Figure 10:
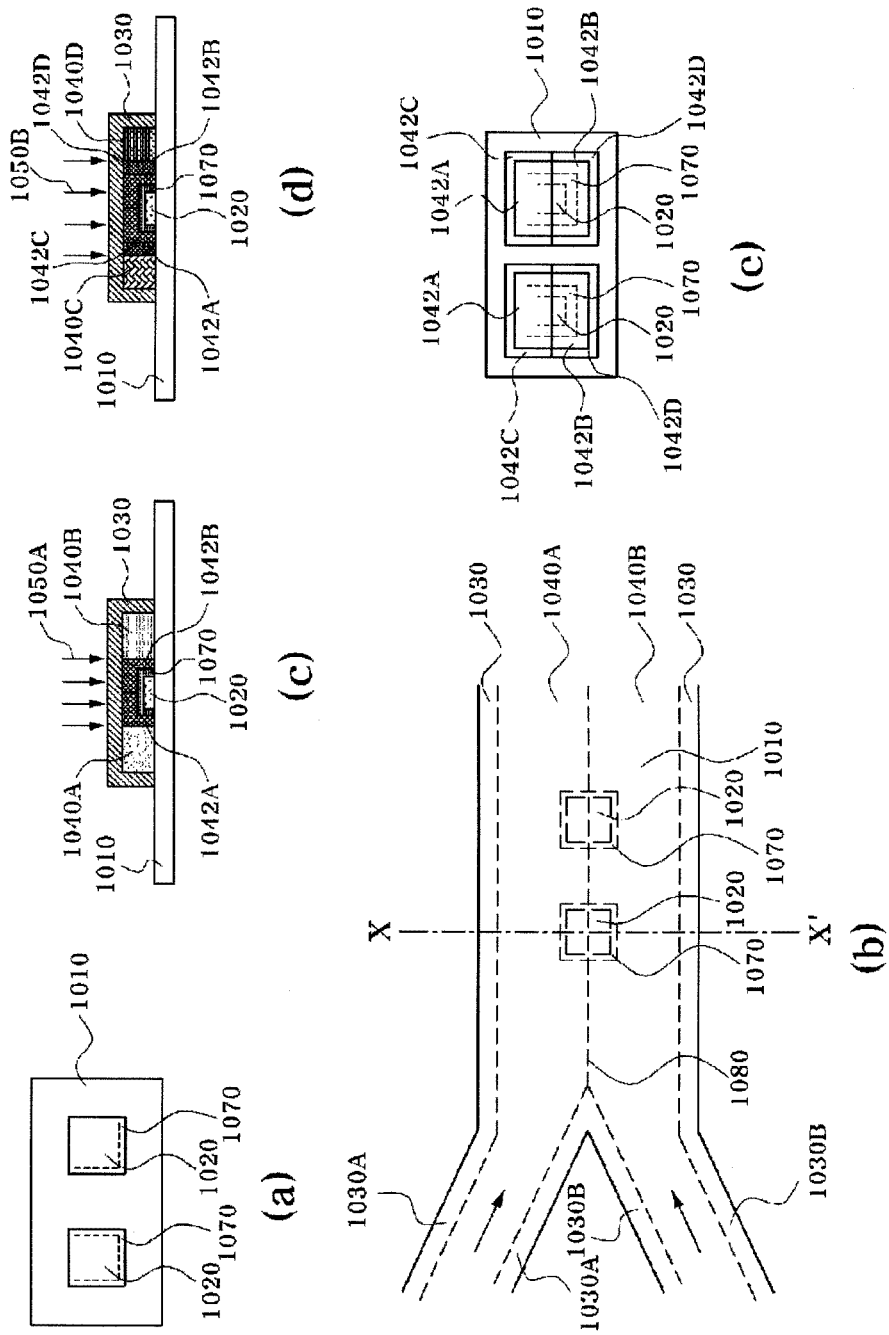
FIGS. 10A through 10E are diagrams illustrating respective steps of a method of coating a light emitting device according to another exemplary embodiment of the present disclosure.

FIGS. 10A through 10E are diagrams illustrating respective steps of a method of coating a light emitting device according to another exemplary embodiment of the present disclosure. FIGS. 10A, 10B, and 10E are plan views, and FIGS. 10C and 10D are cross-sectional view taken along line X-X' of the plan view of FIG. 10B.

Since a step of FIG. 10A is substantially the same as the step described with reference to FIG. 9A, a detailed description thereof will be omitted for brevity.

Since materials and properties of a substrate 1010, a plurality of light emitting devices 1020, and a transmissive layer 1070 are substantially the same as those of the substrate 210, the plurality of light emitting devices 220, and the transmissive layer 270 described with reference to FIGS. 2A through 2F, a detailed description thereof will be omitted for brevity.

Since a step of FIG. 10B is substantially the same as the step described with reference to FIG. 9B, a detailed description thereof will be omitted for brevity.

Since materials and properties of a microfluidic channel 1030 and a plurality of photocurable liquids 1040A and 1040B are substantially the same as those of the microfluidic channel 230 and the first photocurable liquid 240A described with reference to FIG. 2C, a detailed description thereof will be omitted for brevity. Also, since a method of selectively exposing light to the plurality of photocurable liquids 1040A and 1040B is substantially the same as the method of selectively exposing light to the first photocurable liquid 240A described above with reference to FIG. 2C, a detailed description thereof will be omitted for brevity. A pattern of first light 1050A having selected characteristics which is obtained using the above-described method may be programmed. Accordingly, the width and thickness of a coating layer may be controlled using the method described with reference to FIG. 6.

Since a step of FIG. 10C is substantially the same as the step described with reference to FIG. 9C, a detailed description thereof will be omitted for brevity.

A coating layer 1042A and a coating layer 1042B, which constitute a first coating layer, may correspond to the cured photocurable liquid 1040A and the cured photocurable liquid 1040B, respectively. In one embodiment, each of the photocurable liquids 1040A and 1040B may further include a phosphor. Phosphors included in the photocurable liquids 1040A and 1040B may be phosphors having different properties (e.g., different colors).

Referring to FIG. 10D, the plurality of light emitting devices 1020 on which the first coating layer 1042A and 1042B is formed are dipped in a plurality of additional photocurable liquids 1040C and 1040D. Surfaces of the plurality of light emitting devices 1020 are covered with the photocurable liquid 1040C and the photocurable liquid 1040D across an interface 1080. FIG. 10B illustrates that the photocurable liquid 1040C and the photocurable liquid 1040D flow in the same direction. In another embodiment, the photocurable liquids 1040C and 1040D may flow in different directions. For example, the photocurable liquid 1040C may flow from right to left unlike that shown. Light 1050B is selectively exposed to the photocurable liquids 1040C and 1040D so that a second coating layer 1042C and 1042D may be formed on at least partial regions of surfaces of the first coating layer 1042A and 1042B, respectively. In one embodiment, each of the additional photocurable liquids 1040C and 1040D may further include a phosphor. Phosphors included in the photocurable liquids 1040C and 1040D may be phosphors having different properties (e.g., different colors).

Since materials and properties of the plurality of additional photocurable liquids 1040C and 1040D are substantially the same as those of the first photocurable liquid 240A described with reference to FIGS. 2A through 2F, a detailed description thereof will be omitted for brevity. Also, since a method of selectively exposing light to the plurality of additional photocurable liquids 1040C and 1040D is substantially the same as the method of selectively exposing light to the first photocurable liquid 240A described above with reference to FIGS. 2A through 2F, a detailed description thereof will be omitted for brevity. A pattern of second light 1050B having selected characteristics which is obtained using the above-described method may be programmed. Accordingly, the width and thickness of the second coating layer 1042C and 1042D may be controlled using the method described with reference to FIG. 6.

Referring to FIG. 10E, the plurality of light emitting devices 1020 on which the transmissive layer 1070, the first coating layer 1042A and 1042B, and the second coating layer 1042C and 1042D are formed are obtained. The second coating layer 1042C and 1042D corresponds to the plurality of additional cured photocurable liquids 1040C and 1040D.

Referring back to FIGS. 10A through 10E, the height and width of a coating layer coated on the plurality of light emitting devices 1020 may be controlled using fluidic channels having different heights. The microfluidic channels having the different heights may be the microfluidic channels described above with reference to FIGS. 7A through 7E and 8A through 8F. FIGS. 10A through 10E exemplarily illustrate that the transmissive layer 1070 is formed. In another embodiment, when the first coating layer 1042A and 1042B and the second coating layer 1042C and 1042D have a high heat resistance, the transmissive layer 1070 may be omitted. When the above-described photocurable liquid is used as a material for forming the transmissive layer 1070, a pattern of the transmissive layer 1070 may be formed using the method described above with reference to FIG. 2C. However, the present disclosure is not limited thereto, and the pattern of the transmissive layer 1070 may be formed using a method well known to a person having ordinary skill in the art. In addition, FIGS. 10A through 10E exemplarily illustrate that the plurality of light emitting devices 1020 are arranged on the substrate 1010. In another embodiment, when only the plurality of light emitting devices 1020 are coated, the substrate 1010 may be omitted. In another embodiment, the plurality of light emitting devices 1020 may further include an additional coating layer (not shown). In another embodiment, a partial region (not shown) of a top surface of each of the plurality of light emitting devices 1020, which is required for a contact with a bonding wire, may not be covered with the transmissive layer 1070, the coating layer 1042A and 1042B, and the coating layer 1042C and 1042D. The partial region (not shown) required for the contact with the bonding wire may be formed using the method of programming the optical pattern described above with reference to FIGS. 2A through 2F.

FIGS. 11A through 11D are diagrams illustrating respective steps of a method of coating a light emitting device according to another exemplary embodiment of the present disclosure. FIGS. 11A, 11B, and 11D are plan views, and FIG. 11C is a cross-sectional view taken along line XI-XI' of the plan view of FIG. 11B.

Steps of FIGS. 11A through 11D are substantially the same as the steps described with reference to FIGS. 9A through 9D except that some of a plurality of light emitting devices 1120 are covered with a photocurable liquid 1140A, while the remaining light emitting devices 1120 are covered with a photocurable liquid 1140B in the method of coating a light emitting device according to the present disclosure.

Since properties of a substrate 1110, the plurality of light emitting devices 1120, a microfluidic channel 1130, branch channels 1130A and 1130B, the photocurable liquids 1140A and 1140B, and a transmissive layer 1170 and a method of selectively irradiating light 1150 to the photocurable liquids 1140A and 1140B are respectively substantially the same as the properties of the substrate 910, the plurality of light emitting devices 920, the microfluidic channel 930, the branch channels 930A and 930B, the photocurable liquids 940A and 940B, and the transmissive layer 970 and the method of selectively irradiating the light 950 to the photocurable liquids 940A and 940B, a detailed description thereof will be omitted for brevity.

FIGS. 11A through 11D exemplarily illustrate that coating layers 1142A and 1142B are formed on the plurality of light emitting devices 1120. The coating layer 1142A and the coating layer 1142B correspond to the cured photocurable liquid 1140A and the photocurable liquid 1140B, respectively. In another embodiment, each of the coating layers 1142A and 1142B may further include an additional coating layer (not shown) formed on at least a partial region of a surface thereof. The additional coating layer may be formed using the method described above with reference to FIG. 2C. However, the present disclosure is not limited thereto, and the additional coating layer may be formed using a method well known to a person having ordinary skill in the art. In addition, FIGS. 110A through 11D exemplarily illustrate that the plurality of light emitting devices 1120 are arranged on the substrate 1110. In another embodiment, when only the plurality of light emitting devices 1120 are coated, the substrate 1110 may be omitted. In another embodiment, a partial region (not shown) of a top surface of each of the plurality of light emitting devices 1120, which is required for a contact with a bonding wire, may not be covered with the transmissive layer 1170, the coating layer 1142A, and the coating layer 1142B. The partial region (not shown) required for the contact with the bonding wire may be formed using the method of programming the optical pattern described above with reference to FIGS. 2A through 2F.

Figure 12:
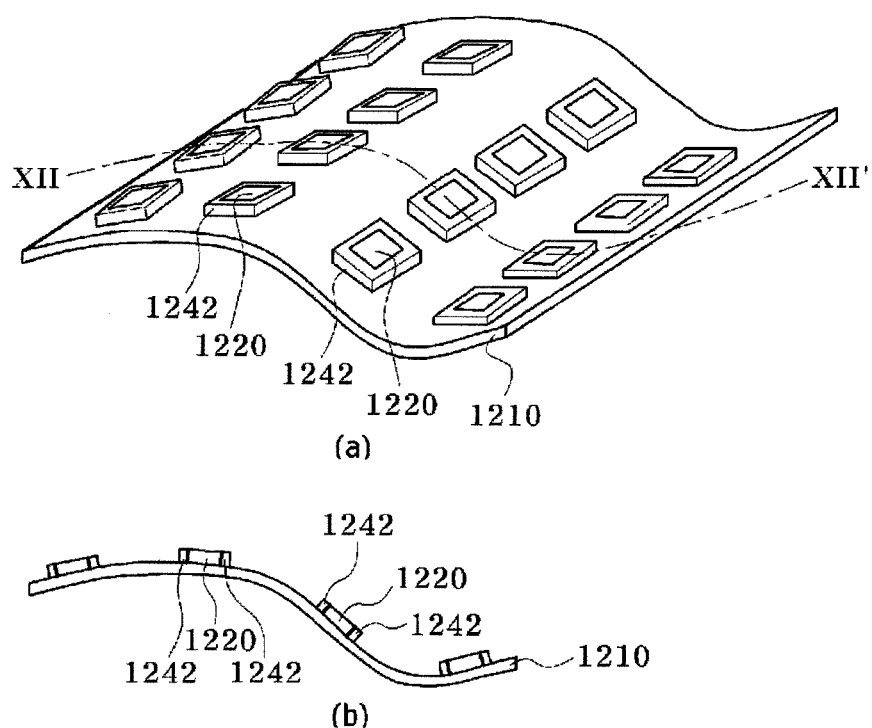
FIGS. 12A and 12B are respectively a perspective view and cross-sectional view of a plurality of light emitting devices arranged on a flexible substrate.

FIGS. 12A and 12B are respectively a perspective view and cross-sectional view of a plurality of light emitting devices arranged on a flexible substrate. FIG. 12B is a cross-sectional view taken along line XII-XII' of FIG. 12A.

Referring to FIGS. 12A and 12B, a plurality of light emitting devices 1220 are arranged on a substrate 1210. A flexible substrate may be used as the substrate 1210. The flexible substrate may be, for example, a plastic substrate, a plastic film, or a flexible PCB. FIGS. 12A and 12B exemplarily illustrate a plastic film as the substrate 1210. In some embodiments, one surface of the plastic film may have an adhesive property, and the plurality of light emitting devices 1220 may be adhered to the one surface of the plastic film. Since the plastic film may be easily bent, the plurality of light emitting devices 1220 may be easily assembled in a circuit substrate or an integrated circuit (IC) package having various surface topologies or a surface step difference.

Referring to FIGS. 12A and 12B, a single coating layer 1242 may be disposed on lateral surfaces of the plurality of light emitting devices 1220. In another embodiment, unlike that shown, a plurality of coating layers (not shown) may be disposed on the entire or partial region of a surface of each of the plurality of light emitting devices 1220. Also, a transmissive layer (not shown) may be disposed on the entire or partial region of the surface of each of the plurality of light emitting devices 1220. The coating layer 1242, the plurality of coating layers, or the transmissive layer may be disposed on the surfaces of the plurality of light emitting devices 1220 using the method described with reference to FIGS. 2A through 11D.

FIGS. 13A and 13B are diagrams of a light coupler according to an exemplary embodiment of the present disclosure.

FIG. 13A is a plan view of the light coupler. Referring to FIG. 13A, the light coupler includes a substrate 1310, a plurality of light emitting devices 1320, a first coating layer 1342, a second coating layer 1344, and a plurality of lenses 1390. The light coupler may further include a transmissive layer 1370. Also, the first coating layer 1342 or the second coating layer 1344 may further include a phosphor.

The plurality of light emitting devices 1320 may be arranged on the substrate 1310. FIG. 13A illustrates side-emitting LEDs as the plurality of light emitting devices 1320.

The first coating layer 1342 and the second coating layer 1344 are disposed on at least a partial region of a surface of each of the plurality of light emitting devices 1320 or the plurality of lenses 1390.

The transmissive layer 1370 is disposed between the plurality of light emitting devices 1320 and the first coating layer 1342. In one embodiment, when the first coating layer 1342 or the second coating layer 1344 has a high heat resistance, the transmissive layer 1370 may be omitted.

The plurality of lenses 1390 may be, for example, convex lenses formed of a transmissive material. The convex lenses may be various kinds of convex lenses (e.g., convex lenses having various focal lengths). In one embodiment, at least one of the plurality of lenses 1390 may have a different focal length from the other lenses. Various kinds of materials may be used as a material for forming the plurality of lenses 1390. The plurality of lenses 1390 may be formed of, for example, a transmissive polymer compound. The transmissive polymer compound may be, for example, a mixture of polyethylene glycol (400) diacrylate (PEG-DA available from Polyscience), which is cured due to light, and a known photoinitiator.

The plurality of lenses 1390 function to condense light provided by the plurality of light emitting devices 1320. That is, the plurality of lenses 1390 may function as light couplers. A light coupler refers to a component configured to divide or couple optical signals. In one embodiment, the plurality of light emitting devices (e.g., side-emitting LEDs) 1320 and the plurality of lenses 1390 may serve as an external light source of an LCD panel. The LCD panel, which is a non-emissive device, necessarily requires an external light source to display information on a screen. Light is provided by a BLU to the LCD panel and generated by the external light source connected to a light guide of the BLU. In general, the size of a light source injection port of the light guide through which the external light source is injected is not equal to the size of an emission surface of the light emitting device (e.g., side-emitting LED) as the light source. Accordingly, to transmit light generated by the LED to the light guide with minimum loss, it is necessary to control the sizes of the injection port and the emission surface. When the size of the injection port is smaller than the size of the emission surface, light provided by the plurality of light emitting devices 1320 is condensed through the plurality of lenses 1390 so that the size of the injection port may be adjusted to the size of the emission surface. The focal length of each of the plurality of lenses 1390 may be adjusted by controlling the radius of curvature of each thereof. In one embodiment, the plurality of lenses 1390 may be lenses obtained by dipping the plurality of light emitting devices 1320 in a photocurable liquid containing a phosphor and irradiating light having selected characteristics to the photocurable liquid.

FIG. 13B illustrates that light provided by the light emitting device 1320 is condensed by the convex lens 1390. By use of the convex lens 1390, light may be condensed into a light source injection port of a light guide 1357.

Since materials and properties of the substrate 1310, the plurality of light emitting devices 1320, the coating layers 1342 and 1344, and the transmissive layer 1370 are substantially the same as those of the substrate 210, the plurality of light emitting devices 220, the first coating layer 242, and the transmissive layer 270 described above with reference to FIGS. 2A through 2F, a detailed description thereof will be omitted for brevity.

FIGS. 13A and 13B exemplarily illustrate that the coating layers 1342 and 1344 and the transmissive layer 1370 are disposed on only one lateral surface of each of the plurality of light emitting devices 1320. The plurality of lenses 1390 are disposed toward the lateral surfaces of the plurality of light emitting devices 1320. In another embodiment, the coating layers 1342 and 1344 and the transmissive layer 1370 may be disposed to surround the entire surfaces of the plurality of light emitting devices 1320. Furthermore, FIGS. 13A and 13B illustrate convex lenses as the plurality of lenses 1390. In another embodiment, concave lenses may be used as the plurality of lenses 1390. The concave lenses function to emit light provided by the plurality of light emitting devices 1320. In one embodiment, the plurality of light emitting devices 1320 and the plurality of concave lenses 1390 serve as an external light source of an LCD panel. In some cases where an injection port of a light guide of the LCD panel has a greater size than an emission surface of each of the plurality of light emitting devices 1320, the light provided by the plurality of light emitting devices 1320 is emitted through the plurality of concave lenses 1390 so that the size of the injection port may be adjusted to the size of the emission surface. The focal length of each of the plurality of concave lenses 1390 may be controlled by controlling the radius of curvature thereof. In another embodiment, the plurality of light emitting devices 1320 may further include an additional coating layer (not shown). In another embodiment, the second coating layer 1344 may be omitted.

FIG. 14 is a plan view of a modified example of the light coupler of FIG. 13, according to an exemplary embodiment of the present disclosure.

Referring to FIG. 14, the light coupler includes a substrate 410, a plurality of light emitting devices 1420, a first coating layer 1442, a second coating layer 1444, and a plurality of lenses 1490. The light coupler may further include a transmissive layer 1470. Also, each of the first coating layer 1442 and the second coating layer 1444 may further include a phosphor. Since properties of the substrate 1410, the plurality of light emitting devices 1420, the first coating layer 1442, the second coating layer 1444, the plurality of lenses 1490, and the transmissive layer 1470 are substantially the same as the substrate 1310, the plurality of light emitting devices 1320, the first coating layer 1342, the second coating layer 1344, the plurality of lenses 1390, and the transmissive layer 1370 described with reference to FIGS. 13A and 13B, a detailed description thereof will be omitted for brevity.

FIG. 14 exemplarily illustrates that the first coating layer 1442 and the second coating layer 1444 surround surfaces of the plurality of lenses 1490. Properties of light provided by the plurality of light emitting devices 1420 are changed due to the first and second coating layers 1442 and 1444 containing a phosphor while the light is being condensed by the plurality of lenses 1490. In one embodiment, the plurality of lenses 1490 form a space between the plurality of light emitting devices 1420 and the first coating layer 1442, and the space may serve to reduce the influence of high heat generated by the plurality of light emitting devices 1420 on the first coating layer 1442 and the second coating layer 1444. In this case, the transmissive layer 1470 may be omitted. Furthermore, FIG. 14 illustrates that the first coating layer 1442 and the second coating layer 1444 are disposed on only one lateral surface of each of the plurality of light emitting devices 1420. The plurality of lenses 1490 are disposed toward the lateral surfaces of the plurality of light emitting devices 1420 on which the first and second coating layers 1442 and 1444 are formed. In another embodiment, the first coating layer 1442 and the second coating layer 1444 may be disposed to surround the entire surfaces of the plurality of light emitting devices 1420. In another embodiment, at least one of the plurality of lenses 1490 may be disposed in the same way as the coating layer (not shown) described with reference to FIGS. 13A and 13B. In another embodiment, the plurality of lenses 1490 may further include an additional coating layer (not shown) formed on the first coating layer 1442 and the second coating layer 1444. In another embodiment, the second coating layer 1444 may be omitted.

FIGS. 15A through 19 are diagrams illustrating a method of fabricating a light coupler according to an exemplary embodiment of the present disclosure. FIGS. 15A through 18A are plan views, and FIGS. 15B through 18B are cross-sectional views taken along line XV-XV' of the plan views of FIGS. 15A through 18A, respectively.

Referring to FIGS. 15A and 15B, to begin with, a substrate 1510 having a plurality of light emitting devices 1520 arranged on one surface thereof is prepared. Since the substrate 1510 and the plurality of light emitting devices 1520 are substantially the same as the substrate 1310 and the plurality of light emitting devices 1320 described above with reference to FIGS. 13A and 13B, a detailed description thereof will be omitted for brevity. Also, the plurality of light emitting devices 1320 may further include a transmissive layer 1570 formed on surfaces thereof. Although the transmissive layer 1570 may be formed using the method of coating the light emitting device described with reference to FIGS. 2A through 2F, the present disclosure is not limited thereto and the transmissive layer 1570 may be formed using a method well known to a person having ordinary skill in the art.

Referring to FIGS. 16A and 16B, the plurality of light emitting devices 1520 are dipped in a first photocurable liquid 1540A using a microfluidic channel 1530 through which the first photocurable liquid 1540A flows. First light 1550A is selectively exposed to the first photocurable liquid 1540A so that a plurality of lenses 1590 configured to receive light from the plurality of light emitting devices 1520 are formed on the substrate 1510. The plurality of lenses 1590 correspond to the cured first photocurable liquid 1540A.

FIG. 16C is a plan view of the light coupler on which the plurality of lenses 1590 are formed.

Since materials and properties of the microfluidic channel 1530 and the first photocurable liquid 1540A are substantially the same as those of the microfluidic channel 230 and the first photocurable liquid 240A described above with reference to FIG. 2B, a detailed description thereof will be omitted for brevity. Also, since a method of selectively exposing light to the first photocurable liquid 1540A is substantially the same as the method of selectively exposing light to the first photocurable liquid 240A described with reference to FIG. 2C, a detailed description thereof will be omitted for brevity. A pattern of the first light 1550A having selected characteristics which is obtained using the above-described method may be programmed. Accordingly, the width and thickness of the plurality of lenses 1590 may be controlled using the method described with reference to FIG. 6.

Referring to FIGS. 17A and 17B, a second photocurable liquid 1540B is provided to the inside of the microfluidic channel 1530 so that the plurality of light emitting devices 1520 and the plurality of lenses 1590 are dipped in the second photocurable liquid 1540B. Second light 1550B is selectively exposed to the second photocurable liquid 1540B, so that a first coating layer 1542 may be formed on at least a partial region of a surface of each of the plurality of light emitting devices 1520 or the plurality of lenses 1590. The first coating layer 1542 corresponds to the cured second photocurable liquid 1540B. In one embodiment, the second photocurable liquid 1540B may further include a phosphor.

FIG. 17C is a plan view of the light coupler on which the first coating layer 1542 is formed.

Since materials and properties of the second photocurable liquid 1540B are substantially the same as those of the first photocurable liquid 240A described above with reference to FIG. 2A through 2F, a detailed description thereof will be omitted for brevity. Also, since a method of selectively exposing light to the second photocurable liquid 1540B is substantially the same as the method of selectively exposing light to the first photocurable liquid 240A described with reference to FIG. 2C, a detailed description thereof will be omitted for brevity. A pattern of the second light 1550B having selected characteristics which is obtained using the above-described method may be programmed. Accordingly, the width and thickness of the first coating layer 1542 may be controlled using the method described with reference to FIG. 6.

Referring to FIGS. 18A and 18B, a third photocurable liquid 1540C is provided to the inside of the microfluidic channel 1530 so that the plurality of light emitting devices 1520 and the plurality of lenses 1590, on which the first coating layer 1542 is formed, are dipped in the third photocurable liquid 1540C. Third light 1550C is selectively exposed to the third photocurable liquid 1540C, so that a second coating layer 1544 may be formed on at least a partial region of a surface of the first coating layer 1542. The second coating layer 1544 corresponds to the cured second photocurable liquid 1540C. In one embodiment, the third photocurable liquid 1540C may further include a phosphor.

FIG. 18C is a plan view of the light coupler on which the second coating layer 1544 is formed.

Since materials and properties of the third photocurable liquid 1540C are substantially the same as those of the first photocurable liquid 240A described above with reference to FIG. 2A through 2F, a detailed description thereof will be omitted for brevity. Also, since a method of selectively exposing light to the third photocurable liquid 1540C is substantially the same as the method of selectively exposing light to the first photocurable liquid 240A described with reference to FIG. 2C, a detailed description thereof will be omitted for brevity. A pattern of the third light 1550C having selected characteristics which is obtained using the above-described method may be programmed. Accordingly, the width and thickness of the second coating layer 1544 may be controlled using the method described with reference to FIG. 6.

Figure 19:
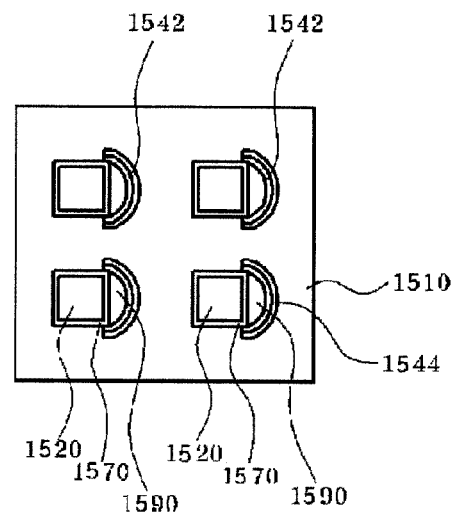

FIG. 19 is a plan view of the light coupler. Referring to FIG. 19, the transmissive layer 1570, the plurality of lenses 1590, the first coating layer 1542, and the second coating layer 1544 formed on the substrate 1510 and at least portions of the surfaces of the plurality of light emitting devices 1520 are obtained.

Figure 16:
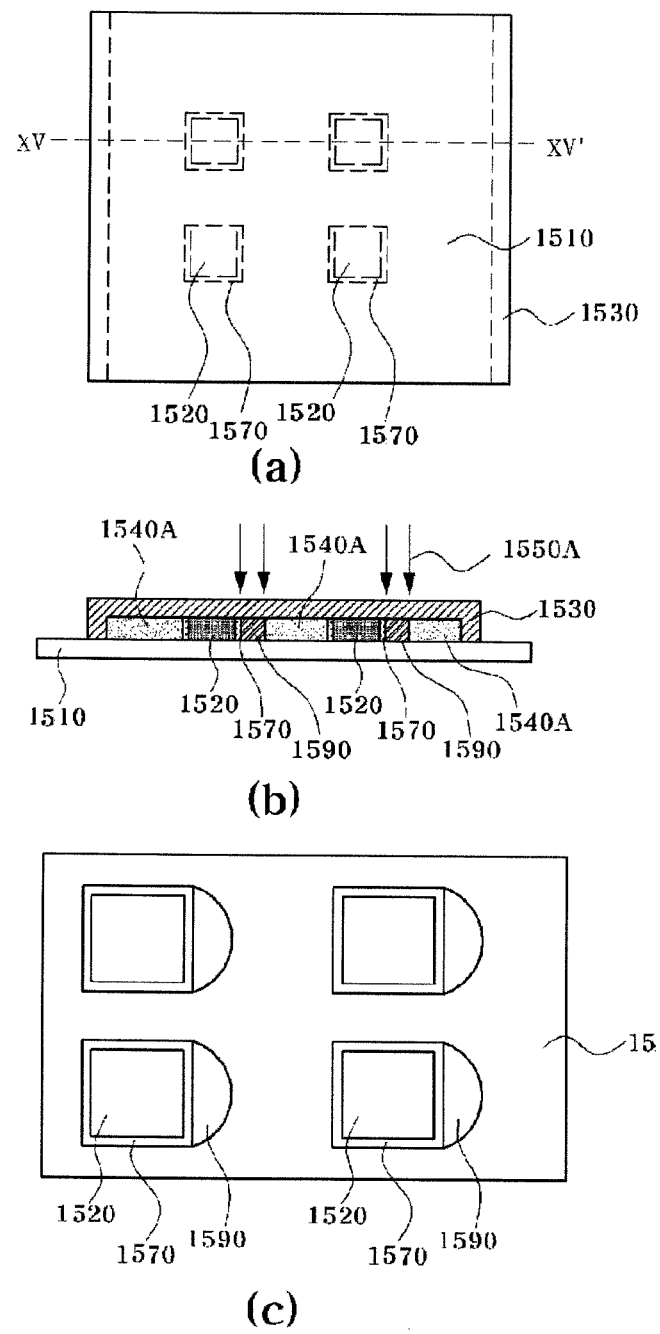

In the method of fabricating the light coupler according to one exemplary embodiment as described with reference to FIGS. 15A through 19, the step of forming the plurality of lenses 1590 described with reference to FIGS. 16A through 16C may be performed after the step of forming the first coating layer 1542 described with reference to FIGS. 17A through 17C or the step of forming the second coating layer 1544 described with reference to FIGS. 18A through 18C.

Figure 18:
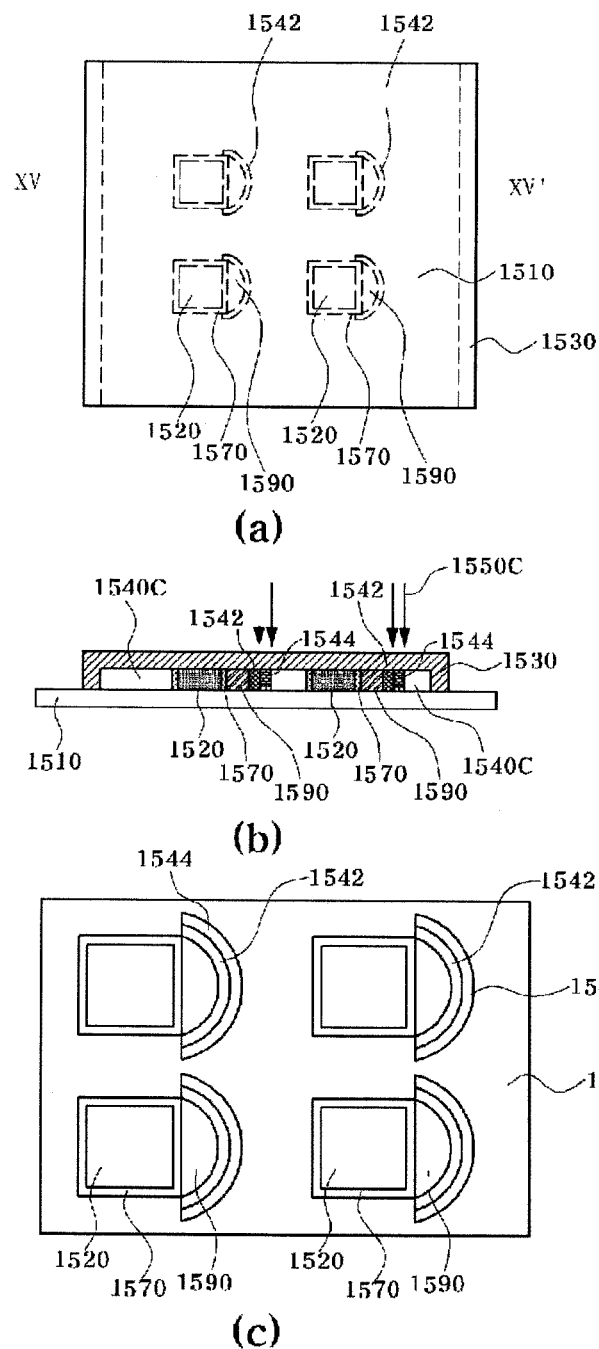

FIGS. 18A through 18C illustrate that the step of forming the second coating layer 1544 is included. In another embodiment, the step of forming the second coating layer 1544 shown in FIGS. 18A through 18C may be omitted. In this case, the plurality of light emitting devices 1520 may include the transmissive layer 1570, the plurality of lenses 1590, and the first coating layer 1542. Also, FIGS. 15A through 19 illustrate that the transmissive layer 1570 is formed. In another embodiment, when each of the plurality of lenses 1590, the first coating layer 1542, or the second coating layer 1544 has a high heat resistance, the transmissive layer 1570 may be omitted. When the above-described photocurable liquid is used as a material for forming the transmissive layer 1570, a pattern of the transmissive layer 1570 may be formed using the method described above with reference to FIG. 2C. However, the present disclosure is not limited thereto, and the pattern of the transmissive layer 1570 may be formed using a method well known to a person having ordinary skill in the art. Also, it is illustrated that the first coating layer 1542 and the second coating layer 1544 are formed on only one lateral surface of each of the plurality of light emitting devices 1520. The plurality of lenses 1590 are disposed toward the lateral surfaces of the plurality of light emitting devices 1520 on which the first and second coating layers 1542 and 1544 are formed. In another embodiment, the first coating layer 1542 and the second coating layer 1544 may be disposed to surround the entire surfaces of the plurality of light emitting devices 1520. In another embodiment, at least one of the plurality of lenses 1590 may have the same shape as the coating layer (not shown) described with reference to FIGS. 13A and 13B. In another embodiment, the plurality of lenses 1590 may further include an additional coating layer (not shown) formed on at least a partial region of a top surface of the second coating layer 1544. The additional coating layer may be formed using the method of coating the light emitting device described with reference to FIGS. 2A through 2F. However, the present disclosure is not limited thereto, and the additional coating layer may be formed using a method well known to a person having ordinary skill in the art.

FIGS. 20A through 20I are diagrams of various shapes of lenses that may be obtained using the method of fabricating the light coupler according to one exemplary embodiment of the present disclosure as described with reference to FIGS. 15A through 19.

Figure 20:
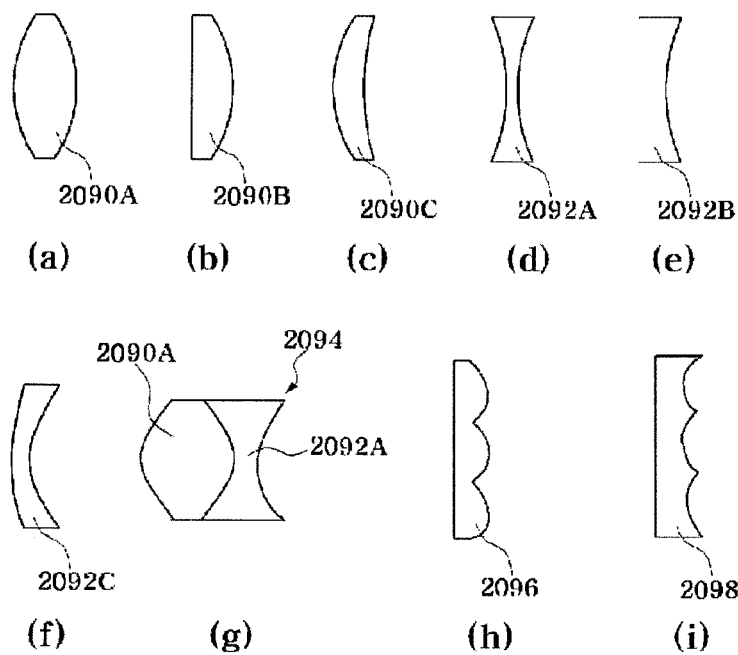
FIGS. 20A through 20I are diagrams of various shapes of lenses that may be obtained using the method of fabricating the light coupler according to one exemplary embodiment of the present disclosure as described with reference to FIGS. 15A through 19.

FIGS. 20A through 20C illustrate convex lenses. A convex lens 2090A of FIG. 20A is a biconvex lens. A convex lens 2090B of FIG. 20B is a plano-convex lens. A convex lens 2090C of FIG. 20C is a meniscus-convex lens. Since functions of the convex lenses 2090A, 2090B, and 2090C are the same as described above with reference to FIGS. 13A and 13B, a detailed description thereof will be omitted for brevity.

FIGS. 20D through 20F illustrate concave lenses. A concave lens 2092A of FIG. 20D is a biconcave lens. A concave lens 2092B of FIG. 20E is a plano-concave lens. A concave lens 2092C of FIG. 20F is a meniscus-concave lens. Since functions of the concave lenses 2092A, 2092B, and 2092C are described above with reference to FIGS. 13A and 13B, a detailed description will be omitted for brevity.

FIGS. 20G through 20I are diagrams of various lenses 2094, 2096, and 2098 that may be obtained using convex lenses, concave lenses, and combinations thereof.

Unlike those shown, various shapes of lenses other than the above-described lenses may be fabricated using the method of fabricating the light coupler according to one exemplary embodiment as described with reference to FIGS. 15A through 19. By use of various combinations of lenses, light provided by a light emitting device may be condensed or emitted in various shapes.

While the disclosure has been shown and described with reference to m certain exemplary embodiments thereof, it will be understood by those skilled in the art that various changes in form and details may be made therein without departing from the scope of the disclosure as defined by the appended claims.

The invention claimed is:

1. A method of coating a light emitting device comprising:
   (a) preparing a plurality of light emitting devices;
   (b) coating the plurality of light emitting devices with a first photocurable liquid;
   (c) selectively exposing first light to the first photocurable liquid to form a first coating layer on at least a partial region of a surface of each of the plurality of light emitting devices, wherein the first coating layer is the cured first photocurable liquid;
   (d) coating the plurality of light emitting devices, on which the first coating layer is formed, with a second photocurable liquid; and
   (e) selectively exposing second light to the second photocurable liquid to form a second coating layer on at least a partial region of the surface of each of the plurality of light emitting devices or a surface of the first coating layer, wherein the second coating layer is the cured second photocurable liquid.

2. The method of claim 1, wherein each of the plurality of light emitting devices includes a side-emitting light emitting diode (LED).

3. The method of claim 1, wherein, in step (a), the plurality of light emitting devices are arranged on a substrate.

4. The method of claim 1, wherein a partial region of the surface of each of the plurality of light emitting devices, which is required for a contact with a bonding wire, is not covered with the first coating layer and the second coating layer.

5. The method of claim 1, wherein a thickness of the first coating layer or the second coating layer disposed on a lateral surface of each of the plurality of light emitting devices is controlled by adjusting a horizontal interval between the plurality of light emitting devices and the first light.

6. The method of claim 1, wherein, in step (c) or step (e), light is selectively exposed using an exposure system capable of programming an optical pattern without a photomask.

7. The method of claim 1, further comprising:
   (f) coating the plurality of light emitting devices, on which the first coating layer and the second coating layer are formed, with a third photocurable liquid; and
   (g) selectively exposing third light to the third photocurable liquid to form a third coating layer on at least a partial region of the surface of each of the plurality of light emitting devices and a surface of the first coating layer or the second coating layer, wherein the third coating layer is the cured third photocurable liquid.

8. The method of claim 1, wherein, in step (a), a transmissive layer is formed on at least the partial region of the surface of each of the plurality of light emitting devices.

9. The method of claim 8, wherein a partial region of the surface of each of the plurality of light emitting devices, which is required for a contact with a bonding wire, is not covered with the transmissive layer.

10. The method of claim 1, wherein the first photocurable liquid or the second photocurable liquid contains a phosphor.

11. The method of claim 10, wherein the phosphor contains any one selected from a red phosphor, a green phosphor, a blue phosphor, a yellow phosphor, and a combination thereof.

12. The method of claim 1, wherein, in step (b), the plurality of light emitting devices are coated with the first photocurable liquid using a first microfluidic channel containing the first photocurable liquid therein.

13. The method of claim 12, wherein, in step (d), the plurality of light emitting devices on which the first coating layer is formed are coated with the second photocurable liquid by providing the second photocurable liquid to a second microfluidic channel.

14. The method of claim 12, wherein, in step (d), the plurality of light emitting devices on which the first coating layer is formed are coated with the second photocurable liquid by providing the second photocurable liquid to the first microfluidic channel.

15. The method of claim 14, wherein an anti-adhesion layer is formed on an inner lateral surface of the first fluidic channel.

16. The method of claim 14, wherein a thickness of the first coating layer or the second coating layer disposed on a top surface of each of the plurality of light emitting devices is controlled by adjusting a distance between an inner lateral surface of the first microfluidic channel and the top surface of each of the plurality of light emitting devices.

17. The method of claim 1, wherein step (b) comprises:
   (b1) preparing a microfluidic channel, the microfluidic channel including a plurality of microfluidic channels having different sizes connected in series to one another;
   (b2) disposing the plurality of light emitting devices within a first microfluidic channel of the plurality of microfluidic channels; and
   (b3) providing the first photocurable liquid to the inside of the microfluidic channel.

18. The method of claim 17, wherein step (d) comprises:
   (d1) disposing the plurality of light emitting devices on which the first coating layer is formed within a second microfluidic channel of the plurality of microfluidic channels, wherein a height of an inner lateral surface of the second microfluidic channel of the plurality of microfluidic channels is greater than a height of an inner lateral surface of the first microfluidic channel thereof; and
   (d2) providing the second photocurable liquid to the inside of the microfluidic channel.

19. The method of claim 17, wherein a thickness of the first coating layer disposed on a top surface of each of the plurality of light emitting devices is controlled by adjusting a distance between an inner lateral surface of the microfluidic channel and the top surface of each of the plurality of light emitting devices.

20. The method of claim 17, wherein an anti-adhesion layer is formed on an inner lateral surface of the microfluidic channel.

21. A method of coating a light emitting device comprising:
   (a) preparing a plurality of light emitting devices;
   (b) dipping the plurality of light emitting devices in a plurality of photocurable liquids using a microfluidic channel through which the plurality of photocurable liquids flow, wherein the plurality of photocurable liquids contain different phosphors and flow through the microfluidic channel to form an interface therebetween; and
   (c) selectively exposing first light to the plurality of photocurable liquids to form a first coating layer on at least a partial region of a surface of each of the plurality of light emitting devices, wherein the first coating layer is the cured plurality of photocurable liquids.

22. The method of claim 21, wherein each of the plurality of light emitting devices includes a side-emitting LED.

23. The method of claim 21, wherein, in step (a), a transmissive layer is formed on at least a partial region of a surface of each of the plurality of light emitting devices.

24. The method of claim 21, wherein, in step (c), the first light is selectively exposed to the plurality of photocurable liquids using an exposure system capable of programming an optical pattern without a photomask.

25. The method of claim 21, further comprising:
(d) injecting a plurality of additional photocurable liquids to the microfluidic channel, wherein the plurality of additional photocurable liquids contain different phosphors and flow through the microfluidic channel to form an interface therebetween; and
(e) selectively exposing second light to the plurality of additional photocurable liquids to form a second coating layer on at least a partial region of the surface of each of the plurality of light emitting devices or a surface of the first coating layer, wherein the second coating layer is the cured plurality of additional photocurable liquids.

26. A light coupler comprising:
a substrate having a plurality of light emitting devices arranged on one surface thereof;
a plurality of lenses disposed on the one surface of the substrate and configured to receive light from the plurality of light emitting devices; and
a first coating layer disposed on at least a partial region of a surface of each of the plurality of light emitting devices or the plurality of lenses,
wherein the plurality of lenses and the light emitting devices are disposed on the same plane.

27. The light coupler of claim 26, wherein each of the plurality of light emitting devices includes a side-emitting LED.

28. The light coupler of claim 26, wherein the first coating layer includes a phosphor.

29. The light coupler of claim 26, wherein the plurality of lenses include lenses selected from concave lenses, convex lenses, and combinations thereof.

30. The light coupler of claim 26, further comprising a transmissive layer disposed between the plurality of light emitting devices and the first coating layer.

31. The light coupler of claim 26, further comprising a second coating layer disposed on at least a partial region of a surface of the first coating layer.

32. The light coupler of claim 26, wherein each of the plurality of lenses or the first coating layer is made from a photocurable material.

33. A method of fabricating a light coupler comprising:
(a) preparing a substrate having a plurality of light emitting devices arranged on one surface thereof;
(b) forming a plurality of lenses on the one surface of the substrate so that the plurality of lenses and the light emitting devices are disposed on the same plane, the plurality of lenses configured to receive light from the plurality of light emitting devices; and
(c) forming a first coating layer on at least a partial region of a surface of each of the plurality of light emitting devices or the plurality of lenses,
wherein step (c) is performed before or after step (b).

34. The method of claim 33, wherein step (b) comprises:
(b1) dipping the plurality of light emitting devices in a photocurable liquid; and
(b2) selectively exposing light to the photocurable liquid to form the plurality of lenses on the substrate, wherein the plurality of lenses correspond to the cured photocurable liquid.

35. The method of claim 34, wherein, in step (b2), the light is selectively exposed to the photocurable liquid using an exposure system capable of programming an optical pattern without a photomask.

36. The method of claim 33, wherein step (c) comprises:
(c1) dipping the plurality of light emitting devices or the plurality of lenses in a photocurable liquid; and
(c2) selectively exposing light to the photocurable liquid to form the first coating layer on at least the partial region of the surface of each of the plurality of light emitting devices or the plurality of lenses, wherein the first coating layer is the cured photocurable liquid.

37. The method of claim 33, further comprising:
(d) forming a second coating layer on at least a partial region of a surface of the first coating layer.

* * * * *